(12) United States Patent
Choi et al.

(10) Patent No.: US 9,574,032 B2
(45) Date of Patent: *Feb. 21, 2017

(54) COPOLYMER

(71) Applicant: LG CHEM, LTD., Seoul (KR)

(72) Inventors: Sung Ho Choi, Daejeon (KR); Choong Hoon Lee, Daejeon (KR); Ji Yoon Woo, Daejeon (KR); Hyo Ju Kim, Daejeon (KR); Jin Sam Gong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/596,798

(22) Filed: Jan. 14, 2015

(65) Prior Publication Data

US 2015/0158962 A1 Jun. 11, 2015

Related U.S. Application Data

(63) Continuation of application No. PCT/KR2013/012114, filed on Dec. 24, 2013.

(30) Foreign Application Priority Data

Dec. 24, 2012 (KR) .................. 10-2012-0151830
Aug. 30, 2013 (KR) .................. 10-2013-0104464
Aug. 30, 2013 (KR) .................. 10-2013-0104465
Aug. 30, 2013 (KR) .................. 10-2013-0104466
Aug. 30, 2013 (KR) .................. 10-2013-0104467
Dec. 24, 2013 (KR) .................. 10-2013-0162495

(51) Int. Cl.

| *C08F 210/16* | (2006.01) |
|---|---|
| *C08L 51/00* | (2006.01) |
| *C08K 5/132* | (2006.01) |
| *C08K 5/134* | (2006.01) |
| *C08K 5/52* | (2006.01) |
| *H01L 31/048* | (2014.01) |
| *C08J 5/18* | (2006.01) |
| *H01L 31/18* | (2006.01) |
| *H01L 31/049* | (2014.01) |
| *C08L 23/08* | (2006.01) |
| *C08K 5/544* | (2006.01) |
| *C08L 23/00* | (2006.01) |
| *C08F 255/02* | (2006.01) |
| *C08F 8/42* | (2006.01) |
| *C08L 51/06* | (2006.01) |
| *H01L 23/29* | (2006.01) |
| *C09J 151/06* | (2006.01) |
| *C08K 5/14* | (2006.01) |
| *C08K 5/5425* | (2006.01) |
| *C09D 143/04* | (2006.01) |
| *C09D 151/06* | (2006.01) |

(52) U.S. Cl.
CPC .............. *C08F 210/16* (2013.01); *C08F 8/42* (2013.01); *C08F 255/02* (2013.01); *C08J 5/18* (2013.01); *C08K 5/132* (2013.01); *C08K 5/1345* (2013.01); *C08K 5/14* (2013.01); *C08K 5/52* (2013.01); *C08K 5/544* (2013.01); *C08K 5/5425* (2013.01); *C08L 23/00* (2013.01); *C08L 23/08* (2013.01); *C08L 23/0815* (2013.01); *C08L 51/003* (2013.01); *C08L 51/06* (2013.01); *C09D 143/04* (2013.01); *C09D 151/06* (2013.01); *C09J 151/06* (2013.01); *H01L 23/29* (2013.01); *H01L 23/296* (2013.01); *H01L 31/048* (2013.01); *H01L 31/049* (2014.12); *H01L 31/0481* (2013.01); *H01L 31/18* (2013.01); *C08J 2323/08* (2013.01); *C08J 2451/06* (2013.01); *C08L 2203/204* (2013.01); *C08L 2203/206* (2013.01); *C08L 2205/025* (2013.01); *H01L 2924/0002* (2013.01); *Y02E 10/50* (2013.01)

(58) Field of Classification Search
CPC ... C08L 51/003; C08K 5/5415; H01L 31/0481
See application file for complete search history.

(56) References Cited

U.S. PATENT DOCUMENTS

2012/0048354 A1 3/2012 Sato et al.
2012/0073631 A1* 3/2012 Ikenaga et al. ............... 136/251

FOREIGN PATENT DOCUMENTS

| CN | 102422437 A | 4/2012 |
|---|---|---|
| CN | 102449060 A | 5/2012 |
| EP | 2 439 239 A1 | 4/2012 |
| JP | 57-87402 A | 5/1982 |

(Continued)

OTHER PUBLICATIONS

International Search Report, issued in PCT/KR2013/012114, dated Mar. 5, 2014.

(Continued)

*Primary Examiner* — Kuo-Liang Peng
(74) *Attorney, Agent, or Firm* — Birch, Stewart, Kolasch & Birch, LLP

(57) ABSTRACT

A copolymer, a method of manufacturing a copolymer, an encapsulant for optoelectronic devices, and an optoelectronic device are provided. The encapsulant exhibiting excellent adhesion to front substrates and back sheets included in various optoelectronic devices can be provided. Also, the encapsulant capable of maintaining excellent workability and economic feasibility upon manufacture of the device without causing a negative influence on working environments and parts such as optoelectronic elements or wiring electrodes encapsulated in the optoelectronic device can be provided.

13 Claims, 4 Drawing Sheets

(56) References Cited

FOREIGN PATENT DOCUMENTS

| | | |
|---|---|---|
| JP | 2012-190942 A | 10/2012 |
| JP | 2012-214555 A | 11/2012 |
| JP | 2012-243775 A | 12/2012 |
| KR | 10-2010-0123505 A | 11/2010 |
| KR | 10-2012-0023077 A | 3/2012 |

OTHER PUBLICATIONS

Written Opinion of the International Searching Authority, issued in PCT/KR2013/012114, dated Mar. 5, 2014.
Extended European Search Report, dated Jun. 21, 2016, for European Application No. 13869614.1.

* cited by examiner

COPOLYMER

CROSS REFERENCE TO RELATED APPLICATIONS

This application is a Continuation of PCT International Application No. PCT/KR2013/012114, filed on Dec. 24, 2013, which claims priority under 35 U.S.C. 119(a) to Patent Application Nos. 10-2012-0151830 filed in the Republic of Korea on Dec. 24, 2012, 10-2013-0104465 filed in the Republic of Korea on Aug. 30, 2013, 10-2013-0104464 filed in the Republic of Korea on Aug. 30, 2013, 10-2013-0104467 filed in the Republic of Korea on Aug. 30, 2013, 10-2013-0104466 filed in the Republic of Korea on Aug. 30, 2013, 10-2013-0162495 filed in the Republic of Korea on Dec. 24, 2013, all of which are hereby expressly incorporated by reference into the present application.

TECHNICAL FIELD

The present application relates to a copolymer, a method of manufacturing a copolymer, an encapsulant for optoelectronic devices, and an optoelectronic device.

BACKGROUND ART

An optoelectronic device such as a photovoltaic cell, a light emitting diode (LED), or an organic light emitting diode (OLED) may include an encapsulant configured to encapsulate a light emission or light sensing region of the device.

For example, solar cell modules may be typically manufactured using a lamination process of laminating a transparent front substrate serving as a light receiving substrate, an encapsulant, a photovoltaic device, an encapsulant and a back sheet and then heat pressing the laminated body while applying a suction to the laminated body under a vacuum.

An ethylene-vinyl acetate (EVA) resin has been the most widely used as the encapsulant used for the solar cell modules in aspects of the processability, constructability, and cost.

However, the EVA resin exhibits low adhesive strength to elements included in the optoelectronic device and coming in contact with the encapsulant such as the front substrate or the back sheet. Therefore, when the modules are exposed to outdoor environments for a long period of time, they have a problem in that interlayer delamination may occur easily. Also, in a method of manufacturing a solar cell module using an encapsulant including the EVA resin, the EVA resin may be thermally cracked under hot pressing conditions, resulting in the formation of acetic acid gas, etc. Such acetic acid gas causes problems in that it worsens working environments, has a negative influence on photovoltaic devices or electrodes included in the solar cell module, and also causes degradation of the modules and a decline in power generation efficiency, and the like.

Therefore, there is a continuous demand for encapsulants for optoelectronic devices having improved long-term adhesive properties.

DISCLOSURE

Technical Problem

Exemplary embodiments of the present application are directed to providing a novel copolymer, a method of manufacturing a copolymer, an encapsulant for optoelectronic devices including the copolymer, and an optoelectronic device.

Technical Solution

One aspect of the present application provides a copolymer. Here, since the copolymer is, for example, included in an encapsulant for optoelectronic devices, the encapsulant for optoelectronic devices having excellent adhesion to substrates may be provided. The copolymer may be used as an encapsulant configured to encapsulate elements in various optoelectronic devices, but the present application is not limited thereto. For example, the copolymer may be used as an industrial material applied to a heating lamination process, etc.

In this specification, the term "modified olefin resin" or "modified ethylene/α-olefin copolymer" refers to a copolymer including a moiety in which hydrocarbon groups in some silyl groups of an olefin resin engrafted with an unsaturated silane compound are converted into hydroxyl groups and also including a moiety containing an amine functional group, and thus, may be used in the same meaning as a copolymer including a branched chain represented by Formula 1 to be described later. Also, to differentiate from such a modified olefin resin or a modified ethylene/α-olefin copolymer, an ethylene/α-olefin copolymer engrafted only with an unsaturated silane compound in the absence of an aminosilane compound is defined as a "silane-modified olefin resin" or a "silane-modified ethylene/α-olefin copolymer".

According to one exemplary embodiment, the copolymer includes a main chain including a polymerization unit of an olefin-based monomer, and a branched chain bound to the main chain and represented by the following Formula 1.

   [Formula 1]

In Formula 1, $R^1$ and $R^2$ each independently represent a halogen, an amine group, $-R^4R^5$, or $-R^5$ bound to a silicon atom, where $R^4$ represents oxygen, or a sulfur atom, and $R^5$ represents hydrogen, an alkyl group, an aryl group, an aralkyl group, or an acyl group, l is an integer of 1 or 2, $R^3$ represents $-OSiR^6{}_mR^7{}_{(2-m)}R^8$ bound to a silicon atom, $R^6$ and $R^7$ each independently represent a halogen, an amine group, $-R^9R^{10}$, or $-R^{10}$ bound to a silicon atom, where $R^9$ represents oxygen, or a sulfur atom, and $R^{10}$ represents hydrogen, an alkyl group, an aryl group, an aralkyl group, or an acyl group, $R^8$ represents $-(CH_2)_nNR^{11}R^{12}$ bound to a silicon atom, where $R^{11}$ and $R^{12}$ each independently represent hydrogen, or $R^{13}NH_2$ bound to a nitrogen atom, and $R^{13}$ represents an alkylene group, m is an integer of 1 or 2, and n is an integer greater than or equal to 0.

For example, the copolymer includes a branched chain represented by Formula 1 and engrafted with the main chain including a polymerization unit of the olefin-based monomer, and the branched chain may have a structure including a moiety in which hydrocarbon groups in some silyl groups are converted into hydroxyl groups, and also including a moiety containing an amine functional group. As the copolymer includes the amine functional group as well as the moiety converted into the hydroxyl group, for example, hydrogen bonds between the amine functional group and the hydroxyl group on a surface of the glass substrate formed below the encapsulant in the optoelectronic device may be formed to give a superior adhesive strength, and many more hydrogen bonds to the back sheet formed of a fluoride resin on the encapsulant may be formed to give a superior adhesive strength.

According to one exemplary embodiment, the alkyl group in Formula 1 may have 1 to 20, 1 to 12, 1 to 8, or 1 to 4 carbon atoms, and may, for example, be a methyl group, an ethyl group, a propyl group, or a butyl group, but the present application is not limited thereto.

Also, the aryl group may have 6 to 20, 6 to 18, or 6 to 12 carbon atoms, and may, for example, be a phenyl group, or a naphthyl group, but the present application is not limited thereto.

The aralkyl group refers to an alkyl group in which one or more hydrogen atoms of the hydrocarbon group in the alkyl group are substituted with an aryl radical. In this case, the aralkyl group may have 7 to 40, 7 to 19, or 7 to 13 carbon atoms. The carbon atoms of the aralkyl group refer to the number of the sum of carbon atoms included in both the alkyl group and the aryl radical.

The alkylene group may be a linear or branched alkylene group having 1 to 16 carbon atoms, 1 to 12 carbon atoms, 1 to 6 carbon atoms, or 1 to 4 carbon atoms, and may, for example, be an ethylene group, or a propylene group, but the present application is not limited thereto.

Also, the acyl group refers to a functional group represented by RC=O, wherein R represents an alkyl group, or an aryl group. For example, the acyl group may include formyl, acetyl, propionyl, or benzoyl, but the present application is not limited thereto. The alkyl group and the aryl group contained in the acyl group may have the same number of carbon atoms as described above.

According to one exemplary embodiment, at least one of $R^1$ and $R^2$ may be a reactive functional group which may be hydrolyzed by accessing moisture present in the system. For example, $R^1$ and/or $R^2$ may be an alkoxy group, an alkylthio group, an aryloxy group, an acyloxy group, a halogen group, or an amine group. In this case, examples of the alkoxy group may include alkoxy groups having 1 to 20 carbon atoms, 1 to 12 carbon atoms, 1 to 8 carbon atoms, or 1 to 4 carbon atoms, examples of the acyloxy group may include acyloxy groups having 1 to 12 carbon atoms, 1 to 8 carbon atoms, or 1 to 4 carbon atoms, and examples of the alkylthio group may include alkylthio groups having 1 to 12 carbon atoms, 1 to 8 carbon atoms, or 1 to 4 carbon atoms.

According to one exemplary embodiment, $R^1$ and/or $R^2$ in Formula 1 may also be an alkoxy group, and, more particularly, an alkoxy group having 1 to 12 carbon atoms, or 1 to 8 carbon atoms. According to other exemplary embodiments, $R^1$ and/or $R^2$ may be an alkoxy group having 1 to 4 carbon atoms, and, may, for example, include a methoxy group, an ethoxy group, a propoxy group, an isopropoxy group, or a butoxy group. For example, a methoxy group or an ethoxy group may be used according to some exemplary embodiments.

Also, $R^1$ or $R^2$ may be a non-reactive functional group. For example, $R^1$ or $R^2$ may be hydrogen, an alkyl group, an aryl group, or an aralkyl group. As such, the alkyl group may, for example, be an alkyl group having 1 to 12 carbon atoms, 1 to 8 carbon atoms, or 1 to 4 carbon atoms. In addition, the aryl group may be an aryl group having 6 to 18 carbon atoms, or 6 to 12 carbon atoms, for example, a phenyl group, and the aralkyl group may be an aralkyl group having 7 to 19 carbon atoms, or 7 to 13 carbon atoms, for example, a benzyl group.

As such, $R^3$ is a functional group containing both the above-described moiety converted into the hydroxyl group and the moiety containing the amine functional group. As described above, the copolymer according to one exemplary embodiment of the present application may exhibit a superior adhesive strength since hydrogen bonds between amine functional groups and hydroxyl groups on a surface of the glass substrate formed below the encapsulant in the optoelectronic device are formed via $R^3$. Also, the copolymer may exhibit an excellent adhesive strength since more hydrogen bonds with the back sheet formed of a fluoride resin on the encapsulant are formed.

Further, l in Formula 1 may be an integer of 1 or 2, and, according to some exemplary embodiments, may be 2.

According to one exemplary embodiment, preferably, $R^1$ and $R^2$ in Formula 1 may each independently represent a hydroxyl group, or $-R^4R^5$ bound to a silicon atom, where $R^4$ may represent oxygen and $R^5$ may represent an alkyl group, $R^3$ may represent $-OSiR^6{}_mR^7{}_{(2-m)}R^8$ bound to a silicon atom where $R^6$ and $R^7$ may each independently represent a hydroxyl group, or $-R^9R^{10}$ bound to a silicon atom, where $R^9$ may represent oxygen and $R^{10}$ may represent an alkyl group, and $R^8$ may represent $-(CH_2)_nNR^{11}R^{12}$ bound to a silicon atom where $R^{11}$ and $R^{12}$ each independently may represent hydrogen, or $R^{13}NH_2$ bound to a nitrogen atom, where $R^{13}$ may represent an alkylene group.

More preferably, also in Formula 1, $R^1$ and $R^2$ each independently may represent a hydroxyl group, $R^3$ may represent $-OSiR^6{}_mR^7{}_{(2-m)}R^8$ bound to the silicon atom where $R^6$ and $R^7$ each independently may represent a hydroxyl group, and $R^8$ may represent $-(CH_2)_nNR^{11}R^{12}$ bound to the silicon atom where $R^{11}$ may represent hydrogen and $R^{12}$ may represent $R^{13}NH_2$ where $R^{13}$ may represent an alkylene group.

As such, the alkyl group and the alkylene group are the same as described above.

According to one exemplary embodiment, the copolymer may also further include a branched chain bound to the main chain and represented by the following Formula 2.

$$-SiR^{14}{}_oR^{15}{}_{(3-o)} \qquad \text{[Formula 2]}$$

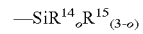

In Formula 2, $R^{14}$ and $R^{15}$ each independently represent a halogen, an amine group, $-R^{16}R^{17}$, or $-R^{17}$ bound to a silicon atom, where $R^{16}$ represents oxygen, or a sulfur atom and $R^{17}$ represents hydrogen, an alkyl group, an aryl group, an aralkyl group, or an acyl group, and o is an integer ranging from 1 to 3.

Preferably, in Formula 2, $R^{14}$ and $R^{15}$ may each independently represent a hydroxyl group, or $-R^{16}R^{17}$ bound to a silicon atom where $R^{16}$ may represent oxygen, and $R^{17}$ may represent an alkyl group.

As described above, since the copolymer according to one exemplary embodiment of the present application includes the amine functional group as well as the moiety converted into the hydroxyl group may have a highly increased conversion rate at which some hydrocarbon groups in the silyl group are converted into hydroxyl groups, compared to a copolymer including only the branched chain represented by Formula 2, for example, a copolymer formed by copolymerizing only an unsaturated silane compound containing a vinyl group at the olefin resin. Therefore, when the copolymer is included in the encapsulant of the optoelectronic device, more hydrogen bonds between the amine functional groups and the hydroxyl groups on a surface of the glass substrate formed below the encapsulant may be formed, compared with the copolymer including only the branched chain represented by Formula 2, to give a superior adhesive strength. Also, more hydrogen bonds with the back sheet formed of a fluoride resin on the encapsulant may be formed to give an excellent adhesive strength.

Another exemplary embodiment of the present application provides a method of manufacturing the copolymer.

According to one exemplary embodiment, the method of manufacturing a copolymer includes adding an olefin resin composition, which includes an olefin resin, an unsaturated silane compound, an aminosilane compound, and a radical initiator, into a reaction vessel, and reactive extruding the olefin resin composition.

According to one exemplary embodiment, the method of manufacturing a copolymer according to one exemplary embodiment of the present application may also further include preparing the olefin resin composition before the reactive extrusion of the olefin resin composition.

The types of the olefin resin are not particularly limited as long as they can be classified as olefins. However, examples of the olefin resin may, for example, be a homopolymer or a copolymer of at least one olefin-based monomer selected from the group consisting of an α-olefin such as ethylene, propylene, isobutylene, 1-butene, 1-pentene, 1-hexene, 1-heptene, 1-octene, 1-nonene, 1-decene, 4-phenyl-1-butene, 6-phenyl-1-hexene, 2-methyl-1-butene, 3-methyl-1-butene, 4-methyl-1-butene, 3-methyl-1-pentene, 4-methyl-1-hexene, 5-methyl-1-hexene, 3,3-dimethyl-1-pentene, 3,4-dimethyl-1-pentene, 4,4-dimethyl-1-pentene, or vinylcyclohexane; a diene such as 1,3-butadiene, 1,4-butadiene, or 1,5-hexadiene; a halogen-substituted α-olefin such as hexafluoropropene, tetrafluoroethylene, 2-fluoropropene, fluoroethylene, 1,1-difluoroethylene, 3-fluoropropene, trifluoroethylene, or 3,4-dichloro-1-butene; and a cyclic olefin such as cyclopentene, cyclohexene, norbonene, 5-methylnorbonene, 5-ethylnorbonene, 5-propylnorbonene, 5,6-dimethylnorbonene, or 5-benzylnorbonene.

Also, the olefin resin includes all types of polymers having different configurations although the olefin resin is formed of a monomer(s) having the same compositions. For example, according to exemplary embodiments of the present application, the configuration of the copolymer included in the olefin resin may be adjusted in a random type, an intersecting type, a block type, or types of different segments to properly adjust a viscosity or physical properties of the resin composition according to a purpose.

According to exemplary embodiments of the present application, the olefin resin may be an ethylene/α-olefin copolymer, an ethylene polymer, a propylene polymer, or an ethylene-vinylacetate copolymer, and, according to one exemplary embodiment, may be an ethylene/α-olefin copolymer.

The term "ethylene/α-olefin copolymer" refers to a polyolefin including ethylene and α-olefin as main components in a polymerized form, and, more particularly, to a copolymer including ethylene at a concentration of at least 50 mol % as a polymerization unit and simultaneously including an olefin monomer having at least three carbon atoms, or another comonomer as a polymerization unit, as well as a homopolymer of ethylene.

For example, the ethylene/α-olefin copolymer may be at least one selected from the group consisting of a low-density ethylene/α-olefin copolymer, a medium-density ethylene/α-olefin copolymer, a high-density ethylene/α-olefin copolymer, a very low-density ethylene/α-olefin copolymer, an extremely very low-density ethylene/α-olefin copolymer, a linear low-density ethylene/α-olefin copolymer, and a combination thereof.

In general, an ethylene/α-olefin copolymer having many side chains has a low density, and an ethylene/α-olefin copolymer having few side chains has a high density. Also, grafting efficiency may increase with an increase in the number of side chains. Therefore, according to one exemplary embodiment of the present application, a low-density ethylene/α-olefin copolymer having many side chains may be used as the olefin resin engrafted with the unsaturated silane compound and aminosilane, thereby, improving the adhesion of the encapsulant due to an enhanced grafting efficiency.

As a result, according to exemplary embodiments of the present application, an ethylene/α-olefin copolymer having a density of approximately 0.85 g/cm$^3$ to 0.96 g/cm$^3$, for example, a density of approximately 0.85 g/cm$^3$ to 0.92 g/cm$^3$, 0.86 g/cm$^3$ to 0.91 g/cm$^3$, 0.87 g/cm$^3$ to 0.90 g/cm$^3$, 0.88 g/cm$^3$ to 0.91 g/cm$^3$, or 0.87 g/cm$^3$ to 0.905 g/cm$^3$ may be particularly used, but the present application is not limited thereto.

Also, the ethylene/α-olefin copolymer may have a melt flow rate (MFR) of approximately 1.0 g/10 minutes to approximately 50.0 g/10 minutes, approximately 1.0 g/10 minutes to 30.0 g/10 minutes, approximately 1.0 g/10 minutes to approximately 10.0 g/10 minutes, approximately 1.0 g/10 minutes to 8.0 g/10 minutes, or approximately 3.0 g/10 minutes to 7.0 g/10 minutes, as measured at a temperature of 190° C. and a load of 2.16 kg. When the MFR is within this range, for example, the olefin resin may have a low molecular weight, and thus, the olefin resin composition may exhibit excellent moldability, and the like. In the case of the ethylene/α-olefin copolymer, such an MFR may, for example, be measured at a temperature of 190° C. and a load of 2.16 kg, but the present application is not limited thereto.

The unsaturated silane compound included in the olefin resin composition is an unsaturated silane compound represented by the following Formula 3, which may be included in a modified olefin resin or a silane-modified olefin resin in a polymerized form by engrafting the unsaturated silane compound into the main chain of the olefin resin including a polymerization unit of an olefin-based monomer in the presence of a radical initiator. That is, the olefin resin composition according to one exemplary embodiment of the present application may be prepared into a graft polymer in which the unsaturated silane compound represented by the following Formula 3 is engrafted into the olefin resin.

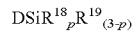

[Formula 3]

In Formula 3, D represents an akenyl group bound to a silicon atom. The akenyl group refers to a functional group containing at least one unsaturated group, for example, a double bond. In this case, the akenyl group may have 2 to 20, 2 to 12, or 2 to 6 carbon atoms. In this case, the akenyl group, for example, D, may be vinyl, allyl, propenyl, isopropenyl, butenyl, hexenyl, cyclohexenyl, or γ-methacryloxypropyl. By way of example, the akenyl group may be vinyl.

$R^{18}$ may represent a hydroxyl group, a halogen, an amine group, or —$R^{20}R^{21}$ bound to a silicon atom, where $R^{20}$ may represent oxygen, or a sulfur atom and $R^{21}$ may represent an alkyl group, an aryl group, or an acyl group, and $R^{19}$ may represent hydrogen, an alkyl group, an aryl group, or an aralkyl group bound to a silicon atom.

According to one exemplary embodiment, $R^{18}$ may be a reactive functional group which may be hydrolyzed by accessing moisture present in the system. A description of $R^{18}$ is omitted since $R^{18}$ represents the same reactive functional group as described above.

Also, $R^{19}$ may be a non-reactive functional group. A description of $R^{19}$ is omitted since $R^{19}$ represents the same non-reactive functional group as described above.

In addition, p in Formula 3 is an integer ranging from 1 to 3, and, according to some exemplary embodiments, may be 3.

In Formula 3, a specific example of the unsaturated silane compound may be a vinyl alkoxy silane. For example, the unsaturated silane compound may include vinyltrimethoxy silane, vinyltriethoxy silane, vinyltripropoxy silane, vinyltriisopropoxy silane, vinyltributoxy silane, vinyltripentoxy silane, vinyltriphenoxy silane, or vinyltriacetoxy silane. By way of example, among these, vinyltrimethoxy silane or vinyltriethoxy silane may, for example, be used herein, but the present application is not limited thereto.

According to one exemplary embodiment, the olefin resin composition may include the unsaturated silane compound of Formula 3 at a content of 0.1 parts by weight to 10.0 parts by weight, 0.5 parts by weight to 7.0 parts by weight, 1.0 part by weight to 5.5 parts by weight, or 0.5 parts by weight to 5.0 parts by weight, based on a total of 100 parts by weight of the solid contents of the olefin resin composition. Within this content range, adhesive properties of the copolymer, for example, adhesive properties to a glass substrate, a back sheet and the like may be maintained excellently.

Unless particularly defined otherwise in this specification, the unit "part(s) by weight" refers to a weight ratio.

According to one exemplary embodiment, the olefin resin composition includes an aminosilane compound. The aminosilane compound may serve as a catalyst promoting hydrolysis in which reactive functional groups such as alkoxy groups in the unsaturated silane compound engrafted into the olefin resin are converted into hydroxyl groups during graft modification of the olefin resin, for example, an ethylene/α-olefin copolymer, thereby further improving the adhesive strength to the glass substrate or the back sheet formed of a fluoride resin, both of which are formed on and below the encapsulant film. At the same time, the aminosilane compound also participates in a direct copolymerization reaction as a reactant to provide a moiety containing the amine functional group to the above-described novel copolymer according to one exemplary embodiment of the present application.

The aminosilane compound may be a compound represented by the following Formula 4.

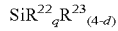    [Formula 4]

In Formula 4, $R^{22}$ represents —$(CH_2)_r NR^{24}R^{25}$ bound to a silicon atom where $R^{24}$ and $R^{25}$ each independently represent hydrogen, or $R^{26}NH_2$ bound to a nitrogen atom, where $R^{26}$ represents an alkylene group having 1 to 6 carbon atoms.

Also, $R^{23}$ represents a halogen, an amine group, —$R^{27}R^{28}$, —$R^{28}$ bound to a silicon atom, where $R^{27}$ represents oxygen, or a sulfur atom and $R^{38}$ represents hydrogen, an alkyl group, an aryl group, an aralkyl group, or an acyl group.

In this case, q is an integer ranging from 1 to 4, and r is an integer greater than or equal to 0.

As such, the alkyl group, the aryl group, the aralkyl group, the acyl group, and the alkylene group are the same as described above, and thus, descriptions of the alkyl group, the aryl group, the aralkyl group, the acyl group, and the alkylene group are omitted for clarity.

Preferably, in Formula 4, $R^{23}$ may represent —$R^{27}R^{28}$ bound to a silicon atom where $R^{27}$ may represent an oxygen atom and $R^{28}$ may represent hydrogen, an alkyl group, an aryl group, an aralkyl group, or an acyl group, $R^{22}$ may represent —$(CH_2)_r NR^{24}R^{25}$ bound to a silicon atom where $R^{24}$ and $R^{25}$ may each independently represent hydrogen, or $R^{24}$ may represent hydrogen and $R^{25}$ may represent $R^{26}NH_2$. As such, $R^{26}$ may be an alkylene group having 1 to 3 carbon atoms. In this case, r may also be an integer ranging from 2 to 5.

The aminosilane compound may be introduced during the modification of the olefin resin, that is, the preparation of a modified olefin resin.

Also, the aminosilane compound does not have a negative influence on another component included in the composition, for example, a UV stabilizer to be described later, and may serve to stably maintain desired physical properties of the composition as a whole.

The aminosilane compound that may be used according to exemplary embodiments of the present application includes a silane compound containing an amine group. Here, primary and secondary amines may be used without limitation as long as they can be used as the silane compound. For example, aminotrialkoxysilane, aminodialkoxysilane, and the like may be used as the aminosilane compound. Examples of the aminotrialkoxysilane and aminodialkoxysilane may include at least one selected from the group consisting of 3-aminopropyltrimethoxysilane (APTMS), 3-aminopropyltriethoxysilane (APTES), bis[(3-triethoxysilyppropyl]amine, bis[(3-trimethoxysilyl)propyl]amine, 3-aminopropylmethyldiethoxysilane, 3-aminopropylmethyldimethoxysilane, N-[3-(trimethoxysilyl)propyl]ethylenediamine (DAS), aminoethylaminopropyltriethoxysilane, aminoethylaminopropylmethyldimethoxysilane, aminoethylaminopropylmethyldiethoxysilane, aminoethylaminomethyltriethoxysilane, aminoethylaminomethylmethyldiethoxysilane, diethylenetriaminopropyltrimethoxysilane, diethylenetriaminopropyltriethoxysilane, diethylenetriaminopropylmethyldimethoxysilane, diethyleneaminomethylmethyldiethoxysilane, (N-phenylamino)methyltrimethoxysilane, (N-phenylamino)methyltriethoxysilane, (N-phenylamino)methylmethyldimethoxysilane, (N-phenylamino)methylmethyldiethoxysilane, 3-(N-phenylamino)propyltrimethoxysilane, 3-(N-phenylamino)propyltriethoxysilane, 3-(N-phenylamino)propylmethyldimethoxysilane, 3-(N-phenylamino)propylmethyldiethoxysilane, and N—(N-butyl)-3-aminopropyltrimethoxysilane. For example, types of the aminosilane compound may be used alone or in combination.

The aminosilane compound may be included at a content of 0.01 to 2.0 parts by weight, for example, a content of 0.01 to 0.5 parts by weight, 0.1 to 0.25 parts by weight, 0.2 to 0.5 parts by weight, 0.5 to 1.25 parts by weight, 0.1 to 1.5 parts by weight, or 0.2 to 2.0 parts by weight, based on a total of 100 parts by weight of the solid contents of the olefin resin composition. Within this content range, physical properties of the resin composition may be effectively adjusted, adhesion to the above-described front substrate and back sheet may be enhanced, and activities of other additives included in the resin composition may be maintained excellently. When the aminosilane compound is added at an excessive amount, a resin may be discolored at the very beginning, or a large amount of gel may be formed during a process, thereby negatively influencing the appearance of manufactured sheets.

The aminosilane compound may be included at a content of 1 to 35 parts by weight, for example, a content of 2 to 6 parts by weight, 2 to 5.5 parts by weight, 5 to 5.5 parts by weight, 2 to 15 parts by weight, 5 to 15 parts by weight, 10 to 35 parts by weight, 5 to 35 parts by weight, 15 to 33.3 parts by weight, or 2 to 33.3 parts by weight, based on a total of 100 parts by weight of the unsaturated silane compound in the olefin resin composition. Also, the aminosilane compound may be included at a content of 1 to 40 parts by weight, for example, a content of 2 to 30 parts by weight, 2 to 25 parts by weight, 1 to 25 parts by weight, 2 to 6 parts by weight, 1 to 10 parts by weight, 4 to 12 parts by weight, 5 to 10 parts by weight, 2 to 10 parts by weight, or 2 to 5 parts by weight, based on a total of 100 parts by weight of the silane compound in the olefin resin composition. When the olefin resin composition, in which the aminosilane compound is adjusted within a content range, is subjected to a reactive extrusion, adhesion between the front substrate and the manufactured encapsulant for optoelectronic devices appears to be excellent. On the other hand, when the aminosilane compound is included at an excessive amount, an increase in the yellowness index of the manufactured encapsulant may result, thereby affecting the other physical properties of the encapsulant film.

The aminosilane compound and the unsaturated silane compound are similar in an aspect of including silyl groups, but differ in an aspect of including amine functional groups and unsaturated groups. Both the aminosilane compound and the unsaturated silane compound are included in the olefin resin composition. In this case, the olefin resin composition may exhibit an excellent adhesive performance, compared to when the olefin resin composition includes only one of the aminosilane compound and the unsaturated silane compound. Here, addition of the aminosilane compound may essentially improve adhesive performance, regardless of the content of the unsaturated silane compound. However, even when the unsaturated silane compound is used at the same content, addition of the aminosilane compound may further improve adhesive performance.

Further, according to the manufacturing method according to one exemplary embodiment of the present application, an encapsulant exhibiting a superior adhesive performance may be provided, compared to when the encapsulant is simply prepared using an alkylsilane or an alkylamine. For example, when only the alkylamine is used, the alkylamine does not participate in a graft polymerization reaction unlike the vinyl silane or the aminosilane compound, and remains as a material remaining in the system. Later on, the alkylamine may move to a surface of the modified olefin resin, or a surface of a sheet when manufactured into an encapsulant in a sheet shape. Therefore, long-term durability may be degraded due to the presence of materials remaining in the system. Further, some alkylamines have a melting point of approximately 27 to 29° C., and thus may exhibit poor miscibility with another reactive material, for example, a liquid silane compound, within a temperature range which is less than or equal to the melting point.

According to one exemplary embodiment, the olefin resin composition includes a radical initiator. The radical initiator may serve to initiate a reaction in which the unsaturated silane compound is engrafted into the olefin resin.

Compounds may be used as the radical initiator without limitation as long as they can initiate a radical polymerization of a vinyl group. For example, the radical initiator may be at least one or two selected from the group consisting of an organic peroxide, a hydroperoxide, and an azo compound. More particularly, the radical initiator may include at least one selected from the group consisting of dialkyl peroxides such as t-butylcumylperoxide, di-t-butyl peroxide, di-cumyl peroxide, 2,5-dimethyl-2,5-di(t-butylperoxy) hexane, and 2,5-dimethyl-2,5-di(t-butylperoxy)-3-hexyne; hydroperoxides such as cumene hydroperoxide, diisopropyl benzene hydroperoxide, 2,5-dimethyl-2,5-di(hydroperoxy) hexane, and t-butylhydroperoxide; diacylperoxides such as bis-3,5,5-trimethylhexanoyl peroxide, octanoyl peroxide, benzoyl peroxide, o-methylbenzoyl peroxide, and 2,4-dichlorobenzoyl peroxide; peroxy esters such as t-butylperoxy isobutyrate, t-butylperoxy acetate, t-butylperoxy-2-ethylhexanoate, t-butylperoxy pivalate, t-butylperoxy octoate, t-butylperoxyisopropyl carbonate, t-butylperoxy benzoate, di-t-butylperoxy phthalate, 2,5-dimethyl-2,5-di(benzoylperoxy)hexane, and 2,5-dimethyl-2,5-di(benzoylperoxy)-3-hexyne; ketone peroxides such as methylethylketone peroxide, and cyclohexanone peroxide; and azo compounds such as lauryl peroxide, azobisisobutyronitrile, and azobis(2,4-dimethylvaleronitrile), but the present application is not limited thereto.

Such a radical initiator may be included at a content of 0.001 parts by weight to 5 parts by weight, based on a total of 100 parts by weight of the solid contents of the olefin resin composition.

The olefin resin composition may further include at least one additive selected from the group consisting of a photostabilizer, a UV absorbent, and a thermal stabilizer, as necessary.

The photostabilizer may serve to capture active species for initiating photo-induced degradation in an olefin resin and prevent photo-oxidation according to applications of the composition. The types of the photostabilizer that may be used herein are not particularly limited. For example, known compounds such as hindered amine-based compounds or hindered piperidine-based compounds may be used herein.

The UV absorbent may serve to absorb UV rays from the rays of sun and the like, convert the UV rays into harmless heat energy in the molecules and prevent active species for initiating photo-induced degradation in the olefin resin from being excited according to applications of the composition. Specific types of the UV absorbent that may be used herein are not particularly limited. For example, inorganic UV absorbents such as benzophenone-based, benzotriazol-based, acrylonitrile-based, metal complex salt-based, hindered amine-based, ultrafine titanium oxide-based and ultrafine zinc oxide-based UV absorbents may be used alone or in combination.

Also, examples of the thermal stabilizer may include phosphorus-based thermal stabilizers such as tris(2,4-di-tert-butylphenyl)phosphite, bis[2,4-bis(1,1-dimethylethyl)-6-methylphenyl]ethylester phosphorous acid, tetrakis(2,4-di-tert-butylphenyl)[1,1-biphenyl]-4,4'-diyl bisphosphonate, and bis(2,4-di-tert-butylphenyl)pentaerythritol diphosphite; and lactone-based thermal stabilizers such as a reaction product of 8-hydroxy-5,7-di-tert-butyl-furan-2-one and o-xylene, which may be used alone or in combination.

In the olefin resin composition, the contents of the photostabilizer, the UV absorbent and/or the thermal stabilizer are not particularly limited. That is, the content of the additives may be properly chosen in consideration of the applications of the resin composition, the shapes or densities of the additives, and the like. Typically, the additives may be properly adjusted at a content of 0.01 parts by weight to 5 parts by weight, based on a total of 100 parts by weight of the solid content of the resin composition.

In addition to the above-described components, the olefin resin composition according to one exemplary embodiment may also further optionally include various additives known in the related art, depending on applications of the resin components.

A method of preparing the copolymer is not particularly limited. However, the copolymer may, for example, be prepared by adding the above-described olefin resin composition into a reaction vessel, mixing the components of the composition in the reaction vessel, and grafting reactive extruding the mixture by hot melting in the presence of a proper radical initiator.

The types of the reaction vessel in which the copolymer is prepared may be used without particular limitation as long as they can be used to prepare a desired resin by allowing reactants to react with each other in a hot molten or liquid state. For example, the reaction vessel may be an extruder or an extruder provided with a hopper. When such a reaction vessel is used, for example, the copolymer may be prepared by adding a liquid unsaturated silane compound, an aminosilane compound and a radical initiator to the olefin resin heated and melted in an extruder and extruding the resulting mixture; or prepared by mixing an olefin resin, a radical initiator, an aminosilane compound and an unsaturated silane compound in a hopper, introducing the resulting mixture into an extruder, and melting the mixture at a high temperature and allowing the mixture to react in the extruder.

Also, other additives such as a UV absorbent, a thermal stabilizer, or a UV stabilizer may be added to the copolymer prepared as described above, and the additives may be put into the reaction vessel before or after formation of the modified olefin resin. By way of example, a process may be simplified by preparing the modified olefin resin and simultaneously mixing the modified olefin resin with the additives in one reaction vessel.

As such, the other additives themselves may be put into the reaction vessel, or may be added in the form of a master batch, and mixed. As such, the master batch refers to a raw material in the form of a pellet which is obtained by concentrating additives to be added at a high concentration and dispersing the additives. When a plastic raw material is typically processed and molded using a method such as extrusion or injection, the master batch may be used to introduce an additive having a certain function in finished products.

As such, a method of putting additives into a reaction vessel in which the modified olefin resin is formed is not particularly limited. For example, a method of installing a side feeder at a proper position in an extruder or a cylinder and introducing an additive in the form of a master batch through the feeder, or a method of mixing an additive with an olefin resin in a hopper and introducing the resulting mixture may be used herein.

In the above-described method, the specific type and design of the reaction vessel, the conditions such as hot melting, mixing, and reaction temperatures and times, or a method of preparing a master batch are not particularly limited, but may be properly chosen in consideration of raw materials used, and the like.

Other exemplary embodiments of the present application are directed to an encapsulant for optoelectronic devices, which includes the above-described copolymer, that is, a modified olefin resin.

According to one exemplary embodiment, the encapsulant for optoelectronic devices includes a modified olefin resin prepared by grafting reactive extruding the above-described olefin resin composition, that is, the above-described copolymer. As described above, the copolymer is formed by engrafting the unsaturated silane compound represented by Formula 3 and the aminosilane compound represented by Formula 4 into the main chain including the polymerization unit of the olefin-based monomer, thereby including the branched chain represented by Formula 1, and thus includes both of a moiety (A) in which hydrocarbon groups in some silyl groups are converted into hydroxyl groups, and a moiety (B) into which a terminal amine functional group is introduced. The silane-modified moiety (A) and the silane-modified moiety (B) into which an amine group is introduced may be present at a ratio of 99:1 to 40:60.

According to one exemplary embodiment, the moiety (A) in which hydrocarbon groups in some silyl groups included in the copolymer in a polymerized form are converted into hydroxyl groups, and the moiety (B) into which the terminal amine functional group is introduced may be measured by a Fourier transform infrared spectroscopy (FT-IR) assay, and a level of conversion of a methoxysilyl group (Si—O—$CH_3$) into a silanol group (Si—OH) caused by the promotion of hydrolysis by an aminosilane compound upon lamination of the encapsulant may also be measured by the FT-IR assay.

For example, the copolymer may have a peak area ratio ($S_a/S_m$) of a peak area ($S_a$) of silanol groups (Si—OH) and amine groups ($NH_2$) in a wavenumber range of 3,100 $cm^{-1}$ to 3,600 $cm^{-1}$ to a peak area ($S_m$) of methylene groups ($CH_2$) in a wavenumber range of 705 $cm^{-1}$ to 735 $cm^{-1}$ of 1.5 or more, for example, 2.0 or more, 2.5 or more, 2.85 or more, 3.5 or more, 5.0 or more, 5.25 or more, 6.0 or more, 6.5 or more, or 7.0 or more, as measured by FT-IR using an attenuated total reflection (ATR) method. An upper limit of the peak area ratio ($S_a/S_m$) of the copolymer is not particularly limited. For example, the peak area ratio ($S_a/S_m$) may be less than or equal to 10.0, 9.0, or 8.0. The peak area ($S_a$) of the silanol groups (Si—OH) and the amine groups ($NH_2$) of the copolymer measured by FT-IR may increase according to the content of the aminosilane compound.

Also, the encapsulant may have a peak area ratio ($S_a/S_m$) of a peak area ($S_a$) of the silanol groups (Si—OH) and amine groups ($NH_2$) in a wavenumber range of 3,100 $cm^{-1}$ to 3,600 $cm^{-1}$ to a peak area ($S_m$) of the methylene groups ($CH_2$) in a wavenumber range of 705 $cm^{-1}$ to 735 $cm^{-1}$ of 0.6 or more, for example, 0.7 or more, 0.8 or more, 0.9 or more, 1.0 or more, 1.1 or more, 1.2 or more, 1.25 or more, 1.5 or more, or 2.0 or more, as measured by FT-IR using the ATR method. An upper limit of the peak area ratio ($S_a/S_m$) of the encapsulant film is not particularly limited. For example, the peak area ratio ($S_a/S_m$) may be less than or equal to 10.0, 9.0, 8.0, 6.0, 5.0, or 4.0. Like the copolymer, the peak area ($S_a$) of the silanol groups (Si—OH) and the amine groups ($NH_2$) of the encapsulant measured by FT-IR may increase according to the content of the aminosilane compound.

The ATR method (i.e., ATR absorption spectroscopy) refers to a method of performing spectroscopic measurements using a phenomenon in which total reflection occurs when a sample (solid or liquid) comes in close contact with a transparent material having a high refractive index such as quartz and incident light irradiates from the side of transparent material, but reflected light is very partially absorbed into the sample in the vicinity of the closely contacted surface. In the FT-IR measurement method according to one exemplary embodiment of the present application, the transparent material may be diamond/zinc selenide (ZnSe), the incidence angle of light may be 45°, and the peak value may be an average of values from measuring the reflected light 32 times.

According to one exemplary embodiment, the peak area of the silanol groups (Si—OH) and the amine groups ($NH_2$) and the peak area of the methylene groups ($CH_2$) may be calculated by measuring the absorption ratio of infrared rays having a wavelength region of 600 $cm^{-1}$ to 4,000 $cm^{-1}$ using a FT-IR measuring machine and measuring each peak area using the absorption ratio of the infrared rays. For example, the peak area of the silanol groups (Si—OH) and the amine groups ($NH_2$) may be calculated by setting a baseline in a wavenumber range of 2,400 $cm^{-1}$ to 3,800 $cm^{-1}$ and integrating the peak area in a wavenumber range of 3,100 $cm^{-1}$ to 3,600 $cm^{-1}$, and the peak area of the methylene groups ($CH_2$) may be calculated by setting a baseline in a wavenumber range of 690 $cm^{-1}$ to 760 $cm^{-1}$ and integrating the peak area in a wavenumber range of 705 $cm^{-1}$ to 735 $cm^{-1}$. As such, the wavenumber refers to a reciprocal (1/λ) of the wavelength of the irradiated infrared rays.

According to one exemplary embodiment, the encapsulant according to one exemplary embodiment of the present application includes the above-described copolymer, and thus exhibits excellent adhesion to a front substrate, for example, a glass substrate, even when laminated at a low lamination temperature. For example, the peel strength of the encapsulant for optoelectronic devices to the glass substrate measured at a peel angle of 90° and a peel rate of 50 mm/min and measured after lamination at a temperature of 110° C. or more, for example, 110° C., 130° C., 140° C., 150° C. or 160° C. may be 50 N/15 mm or more, 60 N/15 mm or more, 70 N/15 mm or more, 80 N/15 mm or more, 90 N/15 mm or more, 100 N/15 mm or more, 110 N/15 mm or more, 60 N/15 mm or more, 120 N/15 mm or more, 130 N/15 mm or more, 140 N/15 mm or more, 150 N/15 mm or more, 160 N/15 mm or more, 165 N/15 mm or more, 170 N/15 mm or more, 180 N/15 mm or more, or 200 N/15 mm or more.

The adhesion between the encapsulant film and the glass substrate increases with an increasing lamination temperature. For example, the relationship between the peel strength of the encapsulant and the lamination temperature of the glass substrate may satisfy the following Equation 1. That is, the encapsulant according to one exemplary embodiment of the present application may, for example, satisfy the following Equation 1.

$$P = \alpha_1 (T_L - 100) + \beta_1 \qquad \text{[Equation 1]}$$

In Equation 1, P represents a peel strength of the encapsulant to the glass substrate as measured at a peel angle of 90° and a peel rate of 50 mm/min, $T_L$ represents a lamination temperature of the encapsulant and the glass substrate, $\alpha_1$ is greater than or equal to 1, and $\beta_1$ is greater than or equal to 40.

Preferably, in Equation 1, $\alpha_1$ may be in a range of 1.5 to 4, and $\beta_1$ may be in a range of 50 to 150. More preferably, $\alpha_1$ may be in a range of 2.5 to 3.3, and $\beta_1$ may be in a range of 70 to 130.

In Equation 1, the lamination temperature of the encapsulant and the glass substrate may be greater than or equal to a temperature of 100° C., for example, may be 110° C., 120° C., 130° C., 140° C., 150° C., 160° C., or 170° C. Also, the lamination may be performed for 15 minutes 30 seconds, for example, performed for 5 minutes in a vacuum, for 30 seconds under a pressure, and for 10 minutes under a residual pressure.

The encapsulant film according to one exemplary embodiment of the present application satisfies Equation 1, and thus exhibits excellent adhesion to the glass substrate when laminated at a temperature of 100° C. or more, and more particularly, at a low temperature of approximately 110° C. Also, since the adhesive strength increases with an increase in the lamination temperature, the encapsulant has advantages in that it may be easily applied to a lamination process performed under various lamination conditions, and productivity may be improved, thereby cutting the production costs.

Also, the encapsulant according to one exemplary embodiment of the present application may have a yellowness index (hereinafter referred to as "YI") value of 0.5 to 2.5, for example, a YI value of 0.5 to 1.0, 0.5 to 1.5, 1.0 to 1.5, 1.25 to 1.5, or 1.25 to 2.5. As the YI value decreases, the optoelectronic device may have superior power generation efficiency.

The term "yellowness index" refers to a value obtained by quantifying the yellowing of the encapsulant when exposed to ultraviolet (UV) rays, which may be measured using a UV/Vis spectrometer according to the ASTM D1925 standard. For example, the reflectance of the encapsulant at a wavelength region of 400 nm to 700 nm may be measured using the UV/Vis spectrometer, and the YI value may be calculated from the reflectance of the encapsulant according to the following Equation 2.

$$YI = [100(1.28 X_{CIE} - 1.06 Z_{CIE})]/Y_{CIE} \qquad \text{[Equation 2]}$$

In Equation 2, YI is a value calculated by a UV/VIS/NIR spectrometer using a color difference analysis program, and $X_{CIE}$, $Y_{CIE}$, and $Z_{CIE}$ are relative values represented by red, green, and blue color coordinates, respectively.

Further, the encapsulant according to one exemplary embodiment of the present application has excellent light transmittance. For example, the encapsulant may have a total light transmittance value of 90.0% or more, for example, a total light transmittance value of 91.0% or more, 91.2% or more, 91.3% or more, 91.5% or more, 91.7% or more, 91.9% or more, or 92.1% or more. The total light transmittance of the encapsulant may be adjusted within the above-described transmittance range in consideration of the photoelectric efficiency of the optoelectronic device.

Also, the encapsulant exhibits excellent transparency since the encapsulant has a low haze value. For example, the encapsulant may have a haze value of 4.0% or less, for example 3.5% or less, 3.0% or less, 2.5% or less, 2.0% or less, or 1.5% or less, and the haze of the encapsulant may be adjusted within the above-described haze value range in consideration of the photoelectric efficiency of the optoelectronic device.

The total light transmittance and the haze may be values measured for light with a wavelength of 200 nm or more, for example, light with a wavelength of 300 nm, 350 nm, 400 nm, 450 nm, 500 nm, 550 nm, or 600 nm, using a hazemeter, preferably values measured for light at a wavelength of 550 nm using a hazemeter. For example, the total light transmittance and the haze may also be values measured after the encapsulant is laminated on the glass substrate at a temperature of 110° C., 130° C., or 150° C., but the present application is not limited thereto.

Also, the total light transmittance may be measured using UV/Vis spectroscopy. In this case, the total light transmittance may be a value measured for light with a wavelength of 200 nm or more, for example, light with a wavelength range of 200 nm to 1,300 nm, 250 to 1,300 nm, or 300 to 1,100 nm, using UV/Vis spectroscopy.

The encapsulant for optoelectronic devices according to exemplary embodiments of the present application may include a non-modified olefin resin in addition to the modified olefin resin. Specific types of the non-modified olefin resin that may be used according to exemplary embodiments of the present application are not particularly limited. For example, a polyethylene may be used as the non-modified olefin resin. More particularly, an ethylene/α-olefin copolymer belonging to the same category as the ethylene/α-olefin copolymer used in the preparation of the modified olefin resin as described above may be used.

The content ratio of non-modified olefin resin and the modified olefin resin may be 1:1 to 20:1, for example, 1:1 to 10:1, 1:1 to 5:1, or 2:1 to 5:1. When the content of the non-modified olefin resin is excessively high, adhesive performance expressed by the modified olefin resin may be easily degraded. On the other hand, when the content of the non-modified resin is excessively low, adhesive performance of the modified olefin resin may be expressed at the very beginning, resulting in degraded processability and undesirable sheet moldability due to gel formation.

The content of the non-modified olefin resin is not particularly limited, and may be chosen in consideration of desired physical properties. For example, the non-modified olefin resin may be included at a content of 0.01 parts by weight to 3,000 parts by weight, 100 parts by weight to 2,000 parts by weight, or 90 parts by weight to 1,000 parts by weight, based on 100 parts by weight of the modified olefin resin.

The respective components may be included in the encapsulant in a state in which the components themselves are uniformly mixed in the encapsulant, and may be included in a state in which the components are molded using various molding methods such as hot melt extrusion, T die molding, and the like.

The shape of the encapsulant is not particularly limited. For example, the encapsulant may be in a shape of a film or sheet. In this case, the encapsulant may be adjusted to a thickness of approximately 10 μm to 2,000 μm, or approximately 100 μm to 1250 μm in consideration of supporting efficiency and breakability of elements, weight reduction, workability of devices, and the like. However, the thickness of the encapsulant may vary according to specific applications.

The encapsulant for optoelectronic devices may be prepared by molding the above-described olefin resin composition in a shape of a film or sheet. Such a molding method is not particularly limited. For example, the encapsulant may be prepared in a shape of a film or sheet using a conventional process such as T die molding, or extrusion. For example, the preparation of the encapsulant may be performed in an in-situ process using a device in which a process of preparing a modified olefin resin from the above-described olefin resin composition is coupled to a film or sheet forming process.

Other exemplary embodiments of the present application are directed to providing an optoelectronic device including an optoelectronic element encapsulated by the above-described encapsulant including the modified olefin resin.

The optoelectronic element encapsulated by the encapsulant may, for example, be a light emitting or light sensing region of a photovoltaic cell, an LED, or an OLED.

The specific structure of the optoelectronic device, or a method of encapsulating an optoelectronic element with the above-described modified olefin resin as will be described later is not particularly limited, and may be properly used to correspond to a purpose according to the corresponding device.

For example, when the optoelectronic device is a photovoltaic cell, the optoelectronic device may be a photovoltaic module including a front substrate 11 or 21, a back sheet 12 or 22, and a photovoltaic device 13 or 23 encapsulated by an encapsulant 14(a), 14(b), or 24 formed between the front substrate 11 or 21 and the back sheet 12 or 22, as shown in FIG. 1 or 2. In this case, the encapsulant may be prepared from the above-described olefin resin composition, and may include the copolymer according to one exemplary embodiment of the present application, that is, a modified olefin resin.

Such a photovoltaic module may be manufactured using a conventional molding method, such as a lamination process, which involves laminating the front substrate, the encapsulant, the photovoltaic device, and the back sheet, and heat pressing the laminated body while applying suction to the laminated body under a vacuum, depending on the desired structure. In this case, the processing conditions of the lamination process are not particularly limited. Typically, the lamination process may be performed at a temperature of 90° C. to 230° C., or 110° C. to 200° C. for 1 to 30 minutes, or 1 to 10 minutes.

In the case of the above-described olefin resin composition, a reactive silyl group, for example, a methoxysilyl group (Si—O—CH$_3$), in a silane-modified moiety of the modified olefin resin which becomes chemically unstable during an extrusion process is accelerated to be hydrolyzed by the aminosilane compound during a modulation process such as the above-described lamination, and converted into a silanol group (Si—OH). Then, chemical covalent bonds may be formed through dehydration condensation with residues such as hydroxyl groups on a surface of the front substrate in the optoelectronic device, thereby giving high adhesion.

Also, fluoride and a silanol group are combined even at the interface with the back sheet having a surface layer including a fluoride polymer often used in recent years to form a hydrogen bond, thereby giving a high interface adhesion unlike the conventional encapsulants. Also, the number of non-covalent bond sites with fluorides may increase due to the presence of the moiety containing amine functional groups introduced by adding a small amount of the aminosilane compound, thereby giving a high adhesive strength.

As such, specific types of the front substrate, the back sheet, and the photovoltaic device, all of which may be used herein, are not particularly limited. For example, the front substrate may be a conventional plate glass; or a transparent composite sheet obtained by stacking glass, a fluoride-based resin sheet, a weather-resistant film and a barrier film; and the back sheet may be a composite sheet obtained by stacking a metal such as aluminum, a fluoride-based resin sheet, a weather-resistant film, and a barrier film, and includes a surface layer including a fluoride polymer. For example, the front substrate and the back sheet may be multi-layer films obtained by forming fluoride polymer layers on both surfaces of a polyethylene terephthalate (PET) film. Also, the photovoltaic device may, for example, be a silicon wafer-based active layer or a thin-film active layer formed by chemical vapor deposition (CVD), and the like.

Advantageous Effects

According to exemplary embodiments of the present application, the encapsulant having improved thermal resistance and excellent adhesion, especially, long-term adhesive properties, to the front substrate and the back sheet included in the various optoelectronic devices can be provided. Also, the parts such as optoelectronic elements or wiring electrodes encapsulated by the encapsulant film in the optoelectronic device, and the optoelectronic device capable of maintaining excellent workability and economic feasibility upon manufacture of the device without causing a negative influence on working environments can be provided.

BEST MODE

Figure 1:
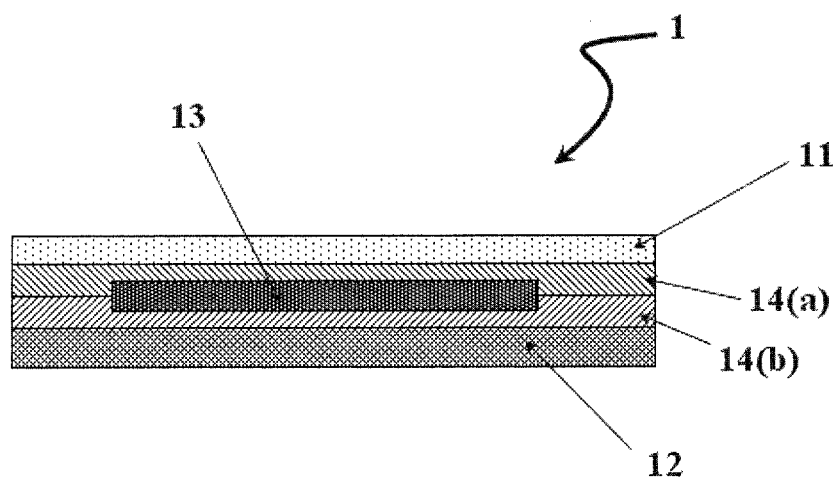
FIGS. 1 and 2 are schematic cross-sectional views showing a photovoltaic module that is an optoelectronic device according to one exemplary embodiment of the present application.
Figure 2:
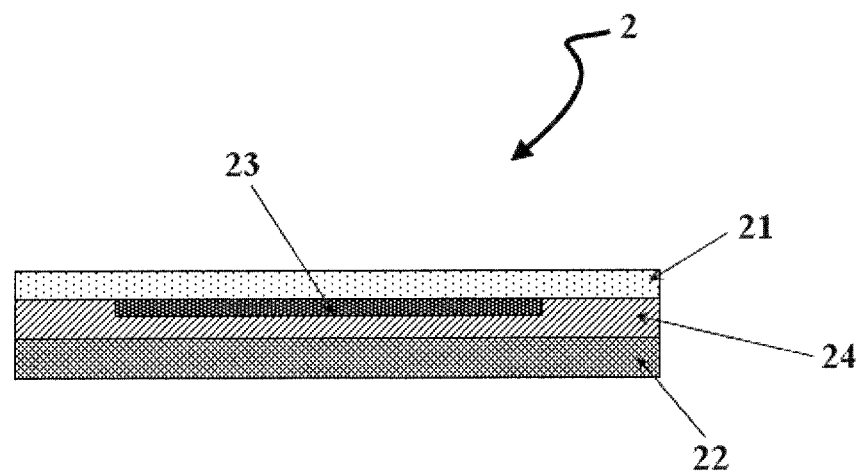

Hereinafter, the present application will be described in greater detail referring to Examples and Comparative Examples of the present application. However, it should be understood that the description proposed herein is just a preferable example for the purpose of illustrations only, not intended to limit the scope of the invention.

<Preparation of Modified Ethylene/α-Olefin Copolymers>

Preparation Example 1

95.01 parts by weight of an ethylene/α-olefin copolymer having a density of 0.870 g/cm$^3$ and an MFR of 5 g/10 minutes at a temperature of 190° C. and a load of 2.16 kg, 4.79 parts by weight of vinyltrimethoxysilane (VTMS), 0.1 parts by weight of 3-aminopropyltrimethoxysilane (APTMS), and 0.1 parts by weight of 2,5-bis(t-butylperoxy)-2,5-dimethylhexane (Luperox® 101) were subjected to graft reactive extrusion (hot melt stirring) at a temperature of 220° C. and a rotary speed of 180 rpm using a twin-screw extruder to prepare a master batch of a modified ethylene/α-olefin copolymer (the term "part(s) by weight" refers to '% by weight', based on a total of 100 parts by weight).

Preparation Examples 2, 3 and 10

Master batches of a modified ethylene/α-olefin copolymer were prepared in the same manner as in Preparation Example 1, except that the contents of the vinyltrimethoxysilane and the 3-aminopropyltrimethoxysilane used in Preparation Example 1 were changed as listed in the following Table 1.

Preparation Examples 4 and 5

Master batches of a modified ethylene/α-olefin copolymer were prepared in the same manner as in Preparation Example 3, except that 3-aminopropyltriethoxysilane (APTES) and N-[3-(trimethoxysilyl)propyl]ethylenediamine (DAS) were used in Preparation Examples 4 and 5, respectively, instead of the 3-aminopropyltrimethoxysilane used in Preparation Example 3.

Preparation Examples 6 and 7

Master batches of a modified ethylene/α-olefin copolymer were prepared in the same manner as in Preparation Examples 1 and 3, respectively, except that an ethylene/α-olefin copolymer having a density of 0.882 g/cm$^3$ and an MFR of 3 g/10 minutes at a temperature of 190° C. and a load of 2.16 kg was used instead of the ethylene/α-olefin copolymer used in Preparation Examples 1 and 3.

Preparation Examples 8 and 9

Master batches of a modified ethylene/α-olefin copolymer were prepared in the same manner as in Preparation Examples 1 and 3, respectively, except that an ethylene/α-olefin copolymer having a density of 0.902 g/cm$^3$ and an MFR of 3 g/10 minutes at a temperature of 190° C. and a load of 2.16 kg was used instead of the ethylene/α-olefin copolymer used in Preparation Examples 1 and 3.

Comparative Preparation Example 1

A master batch of a silane-modified ethylene/α-olefin copolymer was prepared in the same manner as in Preparation Example 1, except that vinyltrimethoxysilane was used at a content of 4.89 parts by weight without using the 3-aminopropyltrimethoxysilane used in Preparation Example 1.

Comparative Preparation Examples 2 and 3

Master batches of a silane-modified ethylene/α-olefin copolymer were prepared in the same manner as in Preparation Example 3, except that dodecylamine (DA) and trimethoxypropylsilane (TMS) were used in Comparative Preparation Examples 2 and 3, respectively, instead of the 3-aminopropyltrimethoxysilane used in Preparation Example 3.

Comparative Preparation Example 4

A master batch of a silane-modified ethylene/α-olefin copolymer was prepared in the same manner as in Comparative Preparation Example 1, except that an ethylene/α-olefin copolymer having a density of 0.882 g/cm$^3$ and an MFR of 3 g/10 minutes at a temperature of 190° C. and a load of 2.16 kg was used instead of the ethylene/α-olefin copolymer used in Comparative Preparation Example 1.

Comparative Preparation Example 5

A master batch of a silane-modified ethylene/α-olefin copolymer was prepared in the same manner as in Comparative Preparation Example 1, except that an ethylene/α-olefin copolymer having a density of 0.902 g/cm$^3$ and an MFR of 3 g/10 minutes at a temperature of 190° C. and a load of 2.16 kg was used instead of the ethylene/α-olefin copolymer used in Comparative Preparation Example 1.

Comparative Preparation Examples 6 and 7

Master batches of a modified ethylene/α-olefin copolymer were prepared in the same manner as in Preparation Example 1, except that 3-aminopropyltrimethoxysilane was used at contents of 4.89 parts by weight and 0.49 parts by weight in Comparative Preparation Examples 6 and 7, respectively, without using the vinyltrimethoxysilane used in Preparation Example 1.

Comparative Preparation Example 8

A master batch of a modified ethylene/α-olefin copolymer was prepared in the same manner as in Preparation Example 1, except that 2.44 parts by weight of the vinyltrimethoxysilane and 2.45 parts by weight of the 3-aminopropyltrimethoxysilane were used instead of 4.79 parts by weight of the vinyltrimethoxysilane and 0.1 parts by weight of the 3-aminopropyltrimethoxysilane used in Preparation Example 1, respectively.

<Manufacture of Encapsulants and Photovoltaic Cell Modules>

Examples 1 to 5

18 g of an additive master batch were added to, and mixed with a mixed resin, which was obtained by preparing the master batch of the modified ethylene/α-olefin copolymer prepared in each of Preparation Examples 1 to 5, and an ethylene/α-olefin copolymer having a density of 0.870 g/cm$^3$ and an MFR of 5 g/10 minutes at a temperature of 190° C. and a load of 2.16 kg at contents of 200 g and 400 g, respectively, and mixing the master batch of the modified ethylene/α-olefin copolymer and the ethylene/α-olefin copolymer at a mixing ratio of 1:2, so that a final sheet included a photostabilizer (Uvinul 5050H) at 1,000 ppm, a

TABLE 1

| | Base resin (content, density) | VTMS (content) | Luperox ®101 (content) | Aminosilane (content) | Aminosilane content (based on the total silane content) |
|---|---|---|---|---|---|
| Preparation Example 1 | 95.01 wt % (d = 0.870) | 4.79 wt % | 0.1 wt % | APTMS 0.1 wt % | 2 wt % |
| Preparation Example 2 | 95.01 wt % (d = 0.870) | 4.65 wt % | 0.1 wt % | APTMS 0.24 wt % | 5 wt % |
| Preparation Example 3 | 95.01 wt % (d = 0.870) | 4.40 wt % | 0.1 wt % | APTMS 0.49 wt % | 10 wt % |
| Preparation Example 4 | 95.01 wt % (d = 0.870) | 4.40 wt % | 0.1 wt % | APTES 0.49 wt % | 10 wt % |
| Preparation Example 5 | 95.01 wt % (d = 0.870) | 4.40 wt % | 0.1 wt % | DAS 0.49 wt % | 10 wt % |
| Preparation Example 6 | 95.01 wt % (d = 0.882) | 4.79 wt % | 0.1 wt % | APTMS 0.1 wt % | 2 wt % |
| Preparation Example 7 | 95.01 wt % (d = 0.882) | 4.40 wt % | 0.1 wt % | APTMS 0.49 wt % | 10 wt % |
| Preparation Example 8 | 95.01 wt % (d = 0.902) | 4.79 wt % | 0.1 wt % | APTMS 0.1 wt % | 2 wt % |
| Preparation Example 9 | 95.01 wt % (d = 0.902) | 4.40 wt % | 0.1 wt % | APTMS 0.49 wt % | 10 wt % |
| Preparation Example 10 | 95.01 wt % (d = 0.870) | 3.67 wt % | 0.1 wt % | APTMS 1.22 wt % | 25 wt % |
| Comparative Preparation Example 1 | 95.01 wt % (d = 0.870) | 4.89 wt % | 0.1 wt % | — | — |
| Comparative Preparation Example 2 | 95.01 wt % (d = 0.870) | 4.40 wt % | 0.1 wt % | DA 0.49 wt % | — |
| Comparative Preparation Example 3 | 95.01 wt % (d = 0.870) | 4.40 wt % | 0.1 wt % | TMS 0.49 wt % | — |
| Comparative Preparation Example 4 | 95.01 wt % (d = 0.882) | 4.89 wt % | 0.1 wt % | — | — |
| Comparative Preparation Example 5 | 95.01 wt % (d = 0.902) | 4.89 wt % | 0.1 wt % | — | — |
| Comparative Preparation Example 6 | 95.01 wt % (d = 0.870) | — | 0.1 wt % | APTMS 4.89 wt % | 100 wt % |
| Comparative Preparation Example 7 | 95.01 wt % (d = 0.870) | — | 0.1 wt % | APTMS 0.49 wt % | 100 wt % |
| Comparative Preparation Example 8 | 95.01 wt % (d = 0.870) | 2.44 wt % | 0.1 wt % | APTMS 2.45 wt % | 50 wt % |

VTMS: vinyltrimethoxysilane
APTMS: 3-aminopropyltrimethoxysilane
APTES: 3-aminopropyltriethoxysilane
DAS: N-[3-(trimethoxysilyl)propyl]ethylenediamine
DA: dodecylamine
TMS: trimethoxypropylsilane UV absorbent (TINUVIN UV531) at 1,000 ppm, a first antioxidant (Irganox1010) at 500 ppm, and a second antioxidant (Irgafosl 68) at 500 ppm. Thereafter, the resulting mixture was put into a hopper of a film molding machine provided with a twin-screw extruder (ϕ 19 mm) and a T die (width: 200 mm), and processed at an extrusion temperature of 180° C. and a ejection rate of 3 m/min to prepare a sheet-shaped encapsulant having a thickness of approximately 500 μm.

A plate glass (thickness: approximately 3 mm), the above-described encapsulant having a thickness of 500 μm, a photovoltaic element of crystalline silicon wafers, the prepared 500 μm-thick encapsulant, and a back sheet (a stacked sheet including a polyvinyl fluoride resin sheet having a thickness of 20 μm, polyethylene terephthalate having a thickness of 250 μm, and a polyvinyl fluoride resin sheet having a thickness of 20 μm; PVDF/PET/PVDF) were laminated in this stacking order, and pressed at 150° C. for 15 minutes 30 seconds in a vacuum laminator to manufacture a photovoltaic cell module.

Examples 6 and 7

Sheet-shaped encapsulants and photovoltaic cell modules were manufactured in the same manner as in Example 1, except that resins, which were obtained by preparing the master batches of the modified ethylene/α-olefin copolymer prepared in Preparation Examples 6 and 7, and an ethylene/α-olefin copolymer having a density of 0.882 g/cm³ and an MFR of 3 g/10 minutes at a temperature of 190° C. and a load of 2.16 kg at contents of 200 g and 400 g, respectively, and mixing the master batches of the modified ethylene/α-olefin copolymer and the ethylene/α-olefin copolymer at a mixing ratio of 1:2, were used, respectively, instead of the mixed resin including the master batch of the modified ethylene/α-olefin copolymer and the ethylene/α-olefin copolymer used in Example 1.

Examples 8 and 9

Sheet-shaped encapsulants and photovoltaic cell modules were manufactured in the same manner as in Example 1, except that resins, which were obtained by preparing the master batches of the modified ethylene/α-olefin copolymer prepared in Preparation Examples 8 and 9, and an ethylene/α-olefin copolymer having a density of 0.902 g/cm³ and an MFR of 3 g/10 minutes at a temperature of 190° C. and a load of 2.16 kg of 3 g/10 minutes at contents of 200 g and 400 g, respectively, and mixing the master batches of the modified ethylene/α-olefin copolymer and the ethylene/α-olefin copolymer at a mixing ratio of 1:2, were used, respectively, instead of the mixed resin including the master batch of the modified ethylene/α-olefin copolymer and the ethylene/α-olefin copolymer used in Example 1.

Example 10

A sheet-shaped encapsulant and a photovoltaic cell module were manufactured in the same manner as in Example 1, except that a resin, which was obtained by preparing the master batch of the modified ethylene/α-olefin copolymer prepared in Preparation Example 3, and an ethylene/α-olefin copolymer having a density of 0.870 g/cm³ and an MFR of 5 g/10 minutes at a temperature of 190° C. and a load of 2.16 kg at contents of 100 g and 500 g, respectively, and mixing the master batch of the modified ethylene/α-olefin copolymer and the ethylene/α-olefin copolymer at a mixing ratio of 1:5, was used instead of the mixed resin including the master batch of the modified ethylene/α-olefin copolymer and the ethylene/α-olefin copolymer used in Example 1.

Example 11

A sheet-shaped encapsulant and a photovoltaic cell module were manufactured in the same manner as in Example 1, except that a resin, which was obtained by preparing the master batch of the modified ethylene/α-olefin copolymer prepared in Preparation Example 3, and an ethylene/α-olefin copolymer having a density of 0.870 g/cm³ and an MFR of 5 g/10 minutes at a temperature of 190° C. and a load of 2.16 kg at contents of 54.5 g and 545.5 g, respectively, and mixing the master batch of the modified ethylene/α-olefin copolymer and the ethylene/α-olefin copolymer at a mixing ratio of 1:10, was used instead of the mixed resin including the master batch of the modified ethylene/α-olefin copolymer and the ethylene/α-olefin copolymer used in Example 1.

Example 12

A sheet-shaped encapsulant and a photovoltaic cell module were manufactured in the same manner as in Example 1, except that a resin, which was obtained by preparing the master batch of the modified ethylene/α-olefin copolymer prepared in Preparation Example 10, and an ethylene/α-olefin copolymer having a density of 0.870 g/cm³ and an MFR of 3 g/10 minutes at a temperature of 190° C. and a load of 2.16 kg at contents of 200 g and 400 g, respectively, and mixing the master batch of the modified ethylene/α-olefin copolymer and the ethylene/α-olefin copolymer at a mixing ratio of 1:2, was used instead of the mixed resin including the master batch of the modified ethylene/α-olefin copolymer and the ethylene/α-olefin copolymer used in Example 1.

Comparative Examples 1 to 3

Sheet-shaped encapsulants and photovoltaic cell modules were manufactured in the same manner as in Example 1, except that the master batches of the silane-modified ethylene/α-olefin copolymer prepared in Comparative Preparation Examples 1 to 3 were used, respectively, instead of the master batch of the modified ethylene/α-olefin copolymer used in Example 1.

Comparative Example 4

A sheet-shaped encapsulant and a photovoltaic cell module were manufactured in the same manner as in Example 1, except that a resin, which was obtained by preparing the master batch of the silane-modified ethylene/α-olefin copolymer prepared in Comparative Preparation Example 4, and an ethylene/α-olefin copolymer having a density of 0.882 g/cm³ and an MFR of 3 g/10 minutes at a temperature of 190° C. and a load of 2.16 kg at contents of 200 g and 400 g, respectively, and mixing the master batch of the silane-modified ethylene/α-olefin copolymer and the ethylene/α-olefin copolymer at a mixing ratio of 1:2, was used instead of the mixed resin including the master batch of the modified ethylene/α-olefin copolymer and the ethylene/α-olefin copolymer used in Example 1.

Comparative Example 5

A sheet-shaped encapsulant and a photovoltaic cell module were manufactured in the same manner as in Example 1, except that a resin, which was obtained by preparing the master batch of the silane-modified ethylene/α-olefin copolymer prepared in Comparative Preparation Example 5, and an ethylene/α-olefin copolymer having a density of 0.902 g/cm³ and an MFR of 3 g/10 minutes at a temperature of 190° C. and a load of 2.16 kg at contents of 200 g and 400 g, respectively, and mixing the master batch of the silane-modified ethylene/α-olefin copolymer and the ethylene/α-olefin copolymer at a mixing ratio of 1:2, was used instead of the mixed resin including the master batch of the modified ethylene/α-olefin copolymer and the ethylene/α-olefin copolymer used in Example 1.

Comparative Examples 6 and 7

Sheet-shaped encapsulants and photovoltaic cell modules were manufactured in the same manner as in Example 1, except that the master batches of the ethylene/α-olefin copolymer prepared in Comparative Preparation Examples 6 and 7 were used, respectively, instead of the master batch of the modified ethylene/α-olefin copolymer used in Example 1.

Comparative Example 8

A sheet-shaped encapsulant and a photovoltaic cell module were manufactured in the same manner as in Example 1, except that a resin, which was obtained by preparing the master batch of the modified ethylene/α-olefin copolymer prepared in Comparative Preparation Example 8, and an ethylene/α-olefin copolymer having a density of 0.870 g/cm³ and an MFR of 3 g/10 minutes at a temperature of 190° C. and a load of 2.16 kg at contents of 200 g and 400 g, respectively, and mixing the master batch of the modified ethylene/α-olefin copolymer and the ethylene/α-olefin copolymer at a mixing ratio of 1:2, was used instead of the mixed resin including the master batch of the modified ethylene/α-olefin copolymer and the ethylene/α-olefin copolymer used in Example 1.

TABLE 2

| | Base resin (content, density) | | | | | Additive |
|---|---|---|---|---|---|---|
| | Base resin (content, density) | Content | VTMS (wt %) | Aminosilane (wt %) | Aminosilane content (based on total silane content) | master batch (content) |
| Example 1 | 400 g (d = 0.870) | 200 g | 4.79 wt % | APTMS 0.1 wt % | 2 wt % | 18 g |
| Example 2 | 400 g (d = 0.870) | 200 g | 4.65 wt % | APTMS 0.24 wt % | 5 wt % | 18 g |
| Example 3 | 400 g (d = 0.870) | 200 g | 4.40 wt % | APTMS 0.49 wt % | 10 wt % | 18 g |
| Example 4 | 400 g (d = 0.870) | 200 g | 4.40 wt % | APTES 0.49 wt % | 10 wt % | 18 g |
| Example 5 | 400 g (d = 0.870) | 200 g | 4.40 wt % | DAS 0.49 wt % | 10 wt% | 18 g |
| Example 6 | 400 g (d = 0.882) | 200 g | 4.79 wt % | APTMS 0.1 wt % | 2 wt % | 18 g |
| Example 7 | 400 g (d = 0.882) | 200 g | 4.40 wt % | APTMS 0.49 wt % | 10 wt % | 18 g |
| Example 8 | 400 g (d = 0.902) | 200 g | 4.79 wt % | APTMS 0.1 wt % | 2 wt % | 18 g |
| Example 9 | 400 g (d = 0.902) | 200 g | 4.40 wt % | APTMS 0.49 wt % | 10 wt % | 18 g |
| Example 10 | 500 g (d = 0.870) | 100 g | 4.40 wt % | APTMS 0.49 wt % | 10 wt % | 18 g |
| Example 11 | 545.5 g (d = 0.870) | 54.5 g | 4.40 wt % | APTMS 0.49 wt % | 10 wt % | 18 g |
| Example 12 | 400 g (d = 0.870) | 200 g | 3.67 wt % | APTMS 1.22 wt % | 25 wt % | 18 g |
| Comparative Example 1 | 400 g (d = 0.870) | 200 g | 4.89 wt % | — | — | 18 g |
| Comparative Example 2 | 400 g (d = 0.870) | 200 g | 4.40 wt % | DA 0.49 wt % | — | 18 g |
| Comparative Example 3 | 400 g (d = 0.870) | 200 g | 4.40 wt % | TMS 0.49 wt % | — | 18 g |
| Comparative Example 4 | 400 g (d = 0.882) | 200 g | 4.89 wt % | — | — | 18 g |
| Comparative Example 5 | 400 g (d = 0.902) | 200 g | 4.89 wt % | — | — | 18 g |
| Comparative Example 6 | 400 g (d = 0.870) | 200 g | — | APTMS 4.89 wt % | 100 wt % | 18 g |
| Comparative Example 7 | 400 g (d = 0.870) | 200 g | — | APTMS 0.49 wt % | 100 wt % | 18 g |
| Comparative Example 8 | 400 g (d = 0.870) | 200 g | 2.44 wt % | APTMS 2.45 wt % | 50 wt % | 18 g |

Experimental Examples

1. Measurement of 90° Peel Strength

To measure peel strengths of the encapsulants prepared in Examples 1 to 12 and Comparative Examples 1 to 8, specimens similar to the manufactured photovoltaic cell modules were manufactured separately. A specimen was manufactured by stacking a plate glass (thickness: approximately 3 mm), the above-described encapsulant having a thickness of 500 µm, and a back sheet (a stacked sheet including a polyvinyl fluoride resin sheet having a thickness of 20 µm, polyethylene terephthalate having a thickness of 250 µm, and a polyvinyl fluoride resin sheet having a thickness of 20 µm; PVDF/PET/PVDF) in this stacking order and laminating the stacked components at 150° C. for 15 minutes 30 seconds in a vacuum laminator. Thereafter, the peel strength was measured according to the ASTM D1897 standard by fixing a lower glass plate of the manufactured specimen, and peeling the encapsulant attached to the back sheet together with the back sheet at a tensile speed of 50 mm/min and a peel angle of 90° in a rectangular shape with a width of 15 mm. The measured peel strengths are listed in the following Table 3.

The average adhesive strengths according to the content range of APS are listed in the following Table 4.

TABLE 4

| Silane master batch | VTMS 100 wt % | APS 2 wt % | APS 5 wt % | APS 10 wt % | APS 25 wt % | APS 50 wt % |
|---|---|---|---|---|---|---|
| Average adhesive strength (N/15 mm) | 79.9 | 211.5 | 264.3 | 287.0 | 208.3 | 162.4 |
| Peel tendency | EN/BS | EN/GL | EN/GL | EN/GL | EN/GL | EN/GL |

EN: Encapsulant
GL: Plate glass
BS: Back sheet
EN/GL: Peeling occurs between encapsulant and plate glass
EN/BS: Peeling occurs between encapsulant and back sheet
EN/GL + BS: Peeling occurs between encapsulant and plate glass/back sheet As listed in Table 3, it was revealed that the sheet-shaped encapsulant including the master batch of the modified ethylene/α-olefin copolymer prepared using both the vinyltrimethoxysilane and the aminosilane showed an excellent adhesive strength, compared to the encapsulant films of Comparative Examples 1 and 3 to 7 in which the vinyltrimethoxysilane, the alkylsilane and the aminosilane were

TABLE 3

| | Base resin (content, density) | Content | VTMS (wt %) | Aminosilane (wt %) | Aminosilane content (based on total silane content) | 90° peel strength (N/15 mm) |
|---|---|---|---|---|---|---|
| Example 1 | 400 g (d = 0.870) | 200 g | 4.79 wt % | APTMS 0.1 wt % | 2 wt % | 176.1 |
| Example 2 | 400 g (d = 0.870) | 200 g | 4.65 wt % | APTMS 0.24 wt % | 5 wt % | 273.3 |
| Example 3 | 400 g (d = 0.870) | 200 g | 4.40 wt % | APTMS 0.49 wt % | 10 wt % | 300.0 |
| Example 4 | 400 g (d = 0.870) | 200 g | 4.40 wt % | APTES 0.49 wt % | 10 wt % | 309.3 |
| Example 5 | 400 g (d = 0.870) | 200 g | 4.40 wt % | DAS 0.49 wt % | 10 wt% | 205.3 |
| Example 6 | 400 g (d = 0.882) | 200 g | 4.79 wt % | APTMS 0.1 wt % | 2 wt % | 369.7 |
| Example 7 | 400 g (d = 0.882) | 200 g | 4.40 wt % | APTMS 0.49 wt % | 10 wt % | 302.7 |
| Example 8 | 400 g (d = 0.902) | 200 g | 4.79 wt % | APTMS 0.1 wt % | 2 wt % | 180.0 |
| Example 9 | 400 g (d = 0.902) | 200 g | 4.40 wt % | APTMS 0.49 wt % | 10 wt % | 350.7 |
| Example 10 | 500 g (d = 0.870) | 100 g | 4.40 wt % | APTMS 0.49 wt % | 10 wt % | 228.7 |
| Example 11 | 545.5 g (d = 0.870) | 54.5 g | 4.40 wt % | APTMS 0.49 wt % | 10 wt % | 170.0 |
| Example 12 | 400 g (d = 0.870) | 200 g | 3.67 wt % | APTMS 1.22 wt % | 25 wt % | 208.3 |
| Comparative Example 1 | 400 g (d = 0.870) | 200 g | 4.89 wt % | — | — | 77.0 |
| Comparative Example 2 | 400 g (d = 0.870) | 200 g | 4.40 wt % | DA 0.49 wt % | — | 132.1 |
| Comparative Example 3 | 400 g (d = 0.870) | 200 g | 4.40 wt % | TMS 0.49 wt % | — | 67.6 |
| Comparative Example 4 | 400 g (d = 0.882) | 200 g | 4.89 wt % | — | — | 97.5 |
| Comparative Example 5 | 400 g (d = 0.902) | 200 g | 4.89 wt % | — | — | 78.0 |
| Comparative Example 6 | 400 g (d = 0.870) | 200 g | — | APTMS 4.89 wt % | 100 wt % | 73.4 |
| Comparative Example 7 | 400 g (d = 0.870) | 200 g | — | APTMS 0.49 wt % | 100 wt % | 68.0 |
| Comparative Example 8 | 400 g (d = 0.870) | 200 g | 2.44 wt % | APTMS 2.45 wt % | 50 wt % | 162.4 | used alone, respectively. Also, it was revealed that the sheet-shaped encapsulant showed the most excellent adhesive strength when the master batch of the modified ethylene/α-olefin copolymer and the non-modified ethylene/α-olefin copolymer were present at a mixing ratio of 1:2. In the case of Comparative Example 2 in which the alkylamine was used alone, the initial peel strength was able to be maintained to at least a certain level, but long-term durability was likely to be degraded due to the alkylamine remaining in the system, which resulted in a high increase in the peel strength measured after being kept under severe conditions.

As listed in Table 4, it was also confirmed that the average adhesive strength was approximately 200 N/15 mm or more when the aminosilane compound in the olefin resin composition was present at a content of 2 to 25% by weight, indicating that the sheet-shaped encapsulant showed a superior adhesive strength.

That is, it could be seen that, when the master batch of the ethylene/α-olefin copolymer modified with both the vinylsilane and the aminosilane was used in a certain content range together with the non-modified ethylene/α-olefin copolymer, the adhesive strengths to the back sheet formed on the encapsulant and the glass substrate formed below the encapsulant were superior, compared to when the vinylsilane, the alkylamine, the aminosilane, or the alkylsilane was used alone in Examples 1 to 12 and Comparative Examples 1 to 8, and Experimental Examples using the encapsulants prepared in Examples 1 to 12 and Comparative Examples 1 to 8.

2. Measurement of 90° Peel Strength with a Change in Lamination Condition

Figure 3:
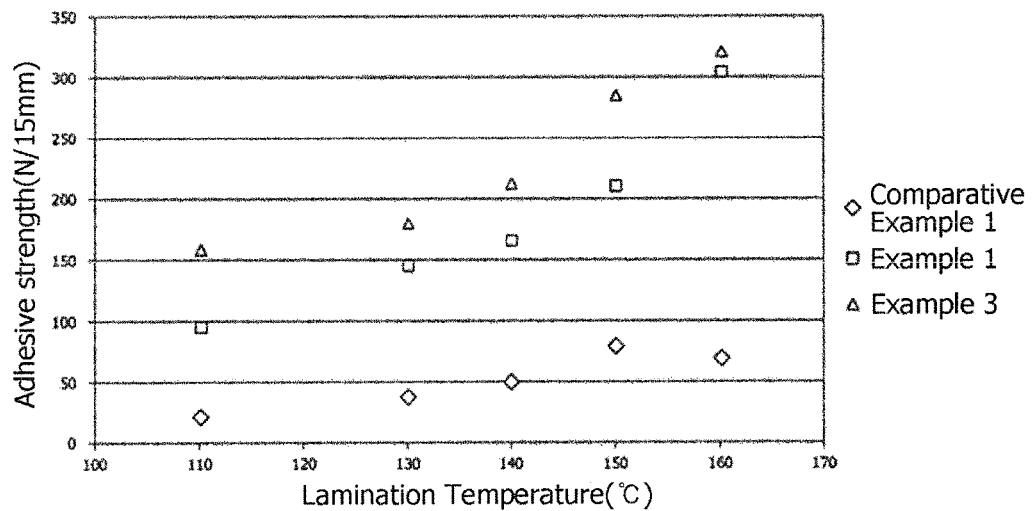
FIG. 3 is a graph illustrating adhesive strengths of encapsulants manufactured in Examples and Comparative Examples of the present application to a glass substrate according to the lamination temperature.

The 90° peel strengths were measured in the same manner as in Experimental Example 1, except that the lamination conditions upon manufacture of similar specimens to the photovoltaic cell modules manufactured with the encapsulants of Examples 1 and 3 were changed as listed in the following Table 5, and the lamination process was performed at temperatures of 110° C., 130° C., 140° C., 150° C., and 160° C. for 6 minutes 30 seconds, 10 minutes 30 seconds, and 15 minutes 30 seconds, respectively, in Experimental Example 1. The measured 90° peel strengths are listed in the following Table 5, and graphs obtained by plotting the adhesive strengths according to the lamination temperature are shown in FIG. 3.

Also, the 90° peel strengths were measured in the same manner as in Experimental Example 1, except that the lamination conditions upon manufacture of similar specimens to the photovoltaic cell module manufactured with the encapsulant of Comparative Example 1 were changed as listed in the following Table 5, and the lamination process was performed at temperatures of 110° C., 130° C., 140° C., 150° C., and 160° C. for 6 minutes 30 seconds, 10 minutes 30 seconds, and 15 minutes 30 seconds, respectively, in Experimental Example 1. The measured 90° peel strengths are listed in the following Table 5, and a graph obtained by plotting the adhesive strengths according to the lamination temperature is shown in FIG. 3.

TABLE 5

| | | 90° Peel strengths (N/15 mm) | | |
|---|---|---|---|---|
| | Lamination condition | Vacuum for 2 min/pressed for 30 sec/pressure retained for 4 min | Vacuum for 3 min/pressed for 30 sec/pressure retained for 7 min | Vacuum for 5 min/pressed for 30 sec/pressure retained for 10 min |
| Comparative Example 1 | 110° C. | 9.0 | 8.5 | 22.5 |
| | 130° C. | 17.8 | 25.6 | 39.0 |
| | 140° C. | 22.5 | 38.3 | 50.4 |
| | 150° C. | 34.2 | 62.0 | 79.9 |
| | 160° C. | 67.5 | 67.9 | 70.0 |
| Example 1 | 110° C. | 63.0 | 86.4 | 96.3 |
| | 130° C. | 64.9 | 115.8 | 145.6 |
| | 140° C. | 99.0 | 153.7 | 167.8 |
| | 150° C. | 126.8 | 186.5 | 211.5 |
| | 160° C. | 184.8 | 246.9 | 305.0 |
| Example 3 | 110° C. | 106.3 | 139.9 | 159.7 |
| | 130° C. | 176.0 | 213.7 | 181.9 |
| | 140° C. | 205.5 | 294.3 | 214.0 |
| | 150° C. | 326.7 | 296.3 | 287.0 |
| | 160° C. | 324.7 | 336.0 | 323.0 |

As listed in Table 5, it was revealed that the encapsulants exhibited excellent adhesive strengths even under various conditions such as lamination temperature and time in the case of Examples 1 and 3 in which the aminosilane was used together with the vinyltrimethoxysilane, compared to Comparative Example 1 in which the vinyltrimethoxysilane was used alone. Also, it was revealed that the encapsulants had excellent adhesive strengths of 50 N/15 mm or more even when the lamination was performed at a low lamination temperature of 110° C.

3. Measurement of Yellowness Index (YI)

The encapsulant films for optoelectronic devices manufactured in Examples and Comparative Examples were measured for reflectance at a wavelength of 400 nm to 700 nm using Colorflex (Hunter lab) according to the ASTM 1925 standard, and YI values were calculated from the measured reflectance values (see the following Equation 2).

$$YI = [100(1.28X_{CIE} - 1.06Z_{CIE})]/Y_{CIE} \quad [\text{Equation 2}]$$

In Equation 2, YI represents a value calculated by a UV/VIS/NIR spectrometer using a color difference analysis program (ASTM, D1925), and $X_{CIE}$, $Y_{CIE}$ and $Z_{CIE}$ are relative values represented by red, green and blue color coordinates, respectively.

The YI values according to the content range of APS are listed in the following Table 6.

TABLE 6

| Silane master batch | VTMS 100 wt % | APS 2 wt % | APS 5 wt % | APS 10 wt % | APS 25 wt % | APS 50 wt % |
|---|---|---|---|---|---|---|
| YI value | 0.98 | 1.23 | 1.25 | 1.43 | 2.49 | 2.7 |

As listed in Table 6, it was revealed that the YI values increased when the aminosilane compound was included at an excessive content in the silane compound of the entire silane master batch.

4. IR Analysis

To detect a branched chain including a moiety in which hydrocarbon groups of some silyl groups in a modified master batch were converted into hydroxyl groups and also including a moiety containing an amine functional group, and to measure a level of conversion of methoxysilyl groups (Si—O—CH$_3$) into silanol groups (Si—OH) by the promotion of hydrolysis by the aminosilane compound during lamination of the encapsulant film, the modified master batches prepared in Preparation Examples 1 to 3 and Comparative Preparation Examples 1 and the encapsulant films prepared in Examples 1 to 3 and Comparative Examples 1 were measured for a peak area of methylene groups (CH$_2$) and a peak area of silanol groups (Si—OH) and amine groups (NH$_2$) in the modified master batches and the encapsulants. Each of the peak areas was measured under the following conditions using the following method.

Diamond/zinc selenide (ZnSe) and each of the manufactured modified master batch and encapsulant specimens were closely adhered to each other in an ATR mode using Varian 660-IR, the incident light was irradiated from the side of the diamond/zinc selenide at an incidence angle of 45° to measure absorption ratio of infrared rays with a region of wavelength of 600 cm$^{-1}$ to 4,000 cm$^{-1}$, and each peak area was measured using the measured absorption ratio. In this case, the peak value may be an average of values from measuring the reflected light 32 times. The peak area of the silanol groups (Si—OH) and amine groups (NH$_2$) was calculated by setting a baseline in a wavenumber range of 2,400 cm$^{-1}$ to 3,800 cm$^{-1}$ and integrating the peak area in a wavenumber range of 3,100 cm$^{-1}$ to 3,600 cm$^{-1}$, and the peak area of the methylene groups (CH$_2$) was calculated by setting a baseline in a wavenumber range of 690 cm$^{-1}$ to 760 cm$^{-1}$ and integrating the peak area in a wavenumber range of 705 cm$^{-1}$ to 735 cm$^{-1}$.

<Measurement Conditions>
Number of illuminations: 32
Resolution: 4

Figure 4:
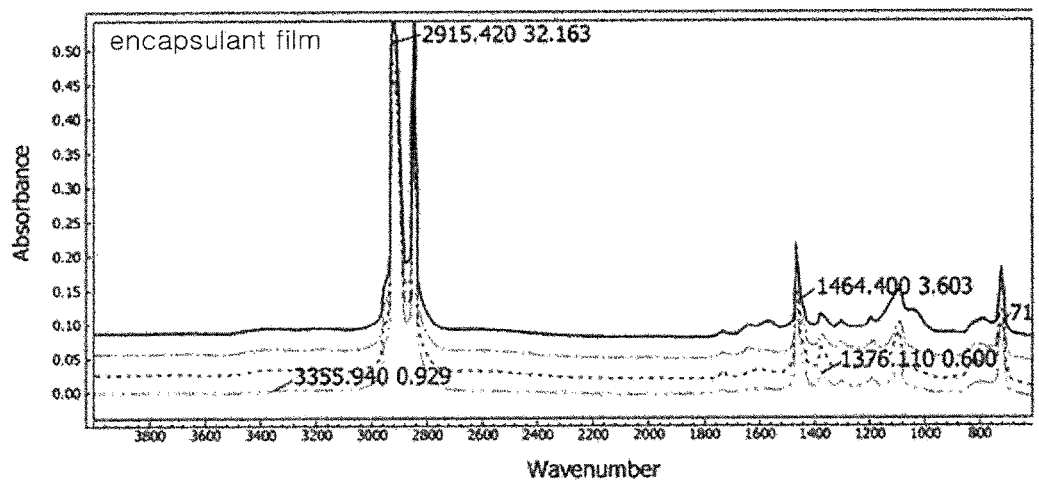
FIG. 4 is a graph illustrating the results obtained by measuring the encapsulants prepared in Preparation Examples and Comparative Preparation Examples of the present application using FT-IR.
Figure 5:
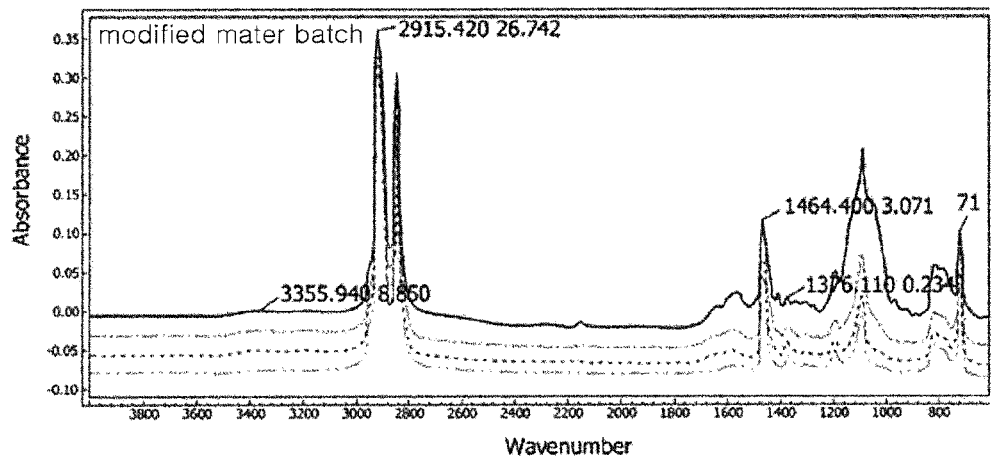
FIG. 5 is a graph illustrating the results obtained by measuring the modified olefin resins prepared in Preparation Examples and Comparative Examples of the present application using FT-IR.

The measurement results of the encapsulant films are listed in the following Table 7 and shown in FIG. 4, and the measurement results of the modified master batches are listed in the following Table 8 and shown in FIG. 5.

TABLE 7

| Sample | APS content | Si—OH & NH$_2$ peak area (S$_a$) | CH$_2$ peak area (S$_m$) | Area ratio (S$_a$/S$_m$) |
|---|---|---|---|---|
| Example 1 | 2 wt % | 1.44 | 1.61 | 0.90 |
| Example 2 | 5 wt % | 2.00 | 1.58 | 1.26 |
| Example 3 | 10 wt % | 3.04 | 1.51 | 2.00 |
| Comparative Example 1 | VTMS 100% | 0.93 | 1.62 | 0.57 |

TABLE 8

| Sample | APS content | Si—OH & NH$_2$ peak area (S$_a$) | CH$_2$ peak area (S$_m$) | Area ratio (S$_a$/S$_m$) |
|---|---|---|---|---|
| Preparation Example 1 | 2 wt % | 4.55 | 1.58 | 2.89 |
| Preparation Example 2 | 5 wt % | 7.80 | 1.48 | 5.27 |
| Preparation Example 3 | 10 wt % | 8.85 | 1.12 | 7.90 |
| Comparative Preparation Example 1 | VTMS 100% | 1.70 | 1.64 | 1.04 |

5. Measurement of Light Transmittance

To measure light transmittances of the encapsulants prepared in Example 3 and Comparative Example 1, specimens were prepared separately. A specimen was prepared by inserting the two above-described encapsulants having a thickness of 500 μm between two slide glasses for an optical microscope (thickness: approximately 1 mm) so that the two encapsulants overlapped each other, and laminating the encapsulants in a vacuum laminator under lamination temperature conditions as listed in the following Table 9. In this case, the specimen was prepared so that the sum of the thicknesses of the two overlapping encapsulant sheets became approximately 500±50 μm using a guide, and measured for haze and total light transmittance with respect to light at a wavelength of 550 nm using a hazemeter. The measured total light transmittance and haze values are listed in the following Table 9. In this case, the transmittance and haze values were calculated as averages of values measured in triplicate after the specimen was loaded into a specimen holder, and measured under conditions according to the JIS K 7105 standard. The lamination time was fixed: under a vacuum for 5 min/pressed for 30 sec/pressure retained for 10 min.

<Measuring Conditions Using UV/Vis Spectroscopy Machine>
Slit width: 32 nm
Detector unit: External (2D detectors)
Time constant: 0.2 seconds

TABLE 9

| | Lamination conditions | Vacuum for 5 min/pressed for 30 sec/ pressure retained for 10 min | | |
|---|---|---|---|---|
| | Temperature | Tt (%) | Td (%) | Haze (%) |
| Comparative Example 1 | 110° C. | 92.1 | 0.6 | 0.7 |
| | 130° C. | 91.5 | 2.4 | 2.6 |
| | 150° C. | 91.4 | 2.8 | 3.1 |
| Example 3 | 110° C. | 92.2 | 0.6 | 0.7 |
| | 130° C. | 91.3 | 2.8 | 3.1 |
| | 150° C. | 91.5 | 2.9 | 3.2 |

Figure 6:
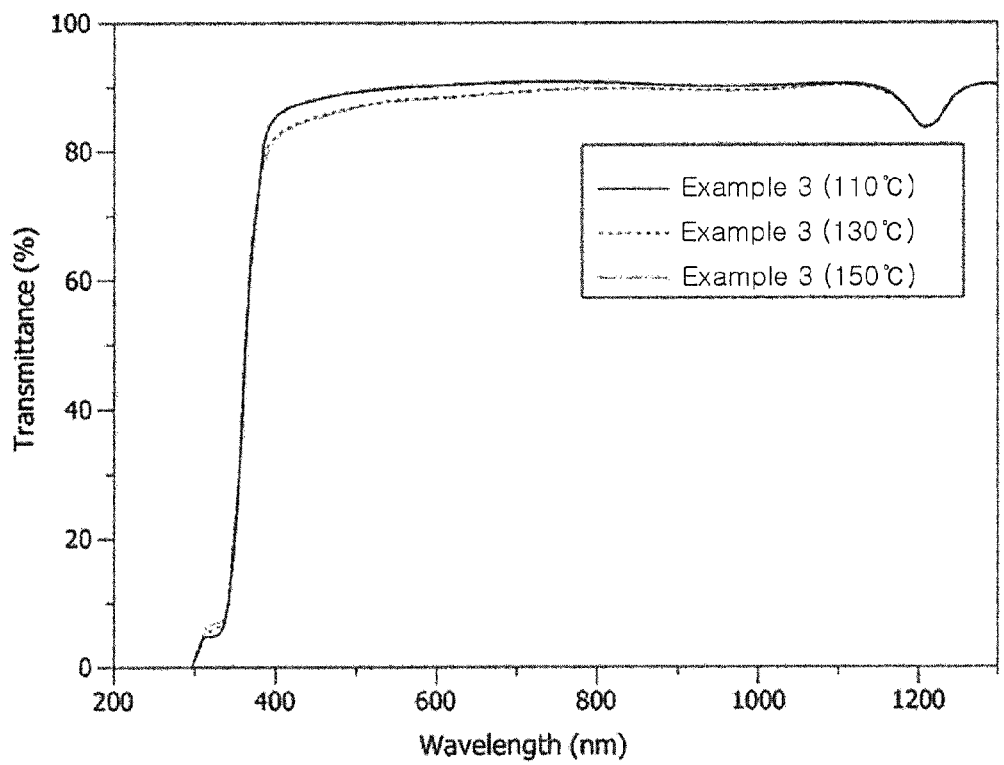
FIG. 6 is a graph illustrating the UV/Vis spectroscopy results of a sample prepared in Example 3 of the present application.
Figure 7:
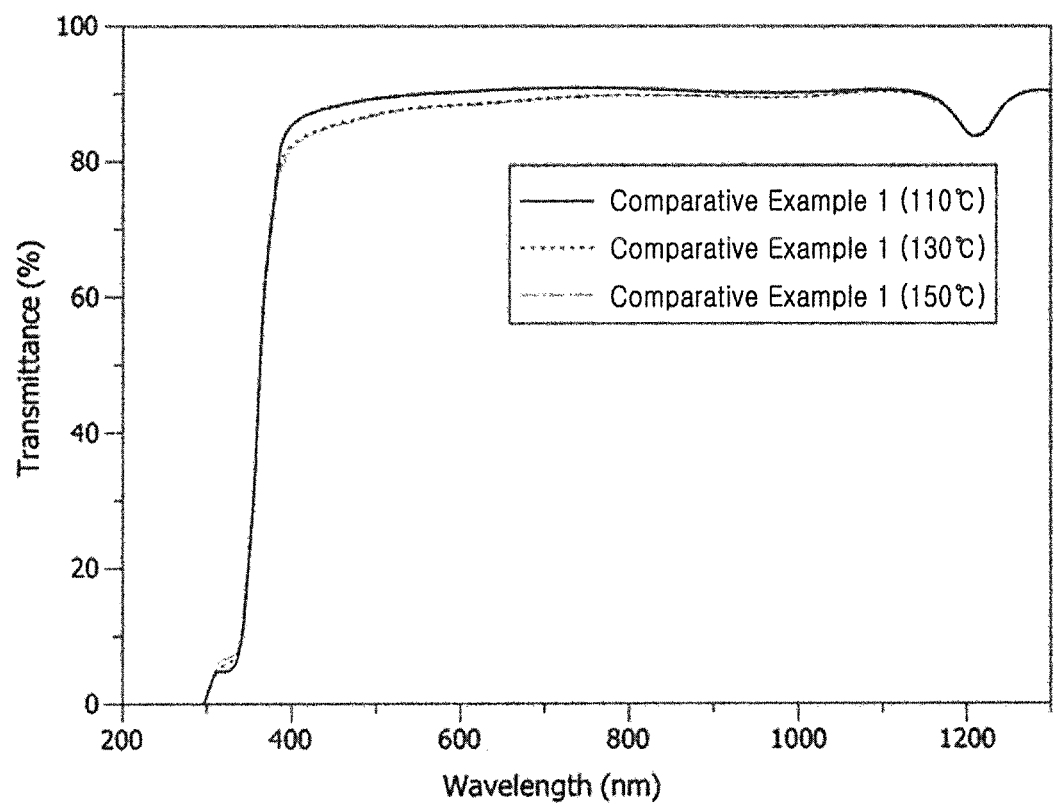
FIG. 7 is a graph illustrating the UV/Vis spectroscopy results of a sample prepared in Comparative Example 1 of the present application.

As seen in Table 9 and shown in FIGS. 6 and 7, it was revealed that the samples which were laminated at a low temperature of 110° C. regardless of the presence of the aminosilane showed low haze and high total light transmittance.

As a result, it could be seen that the encapsulant had a low adhesive strength at a lamination temperature of 110° C., and thus, was unable to be used as a solar encapsulant in the case of Comparative Example 1 in which the vinyltrimethoxysilane was used alone, but the encapsulant showed a high adhesive strength and excellent light transmittance even at a low lamination temperature in the case of Example 3 in which the aminosilane was added.

The invention claimed is:

1. A copolymer comprising
   a main chain comprising a polymerization unit of an olefin-based monomer;
   a branched chain bound to the main chain and represented by the following Formula 1; and
   a branched chain bound to the main chain and represented by the following Formula 2:

—SiR$^1$$_l$R$^2$$_{(2-l)}$R$^3$  [Formula 1] 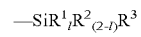

wherein R$^1$ and R$^2$ each independently represent a halogen, an amine group, —R$^4$R$^5$, or —R$^5$ bound to a silicon atom;
   R$^4$ represents oxygen, or a sulfur atom;
   R$^5$ represents hydrogen, an alkyl group, an aryl group, an aralkyl group, or an acyl group;

l is an integer of 1 or 2;

$R^3$ represents —$OSiR^6{}_mR^7{}_{(2-m)}R^8$ bound to a silicon atom;

$R^6$ and $R^7$ each independently represent a halogen, an amine group, —$R^9R^{10}$, or —$R^{10}$ bound to a silicon atom;

$R^9$ represents oxygen, or a sulfur atom;

$R^{10}$ represents hydrogen, an alkyl group, an aryl group, an aralkyl group, or an acyl group;

$R^8$ represents —$(CH_2)_nNR^{11}R^{12}$ bound to a silicon atom;

$R^{11}$ and $R^{12}$ each independently represent hydrogen, or $R^{13}NH_2$ bound to a nitrogen atom;

$R^{13}$ represents an alkylene group;

m is an integer of 1 or 2; and n is an integer greater than or equal to 0, $$—SiR^{14}{}_oR^{15}{}_{(3-o)} \qquad \text{[Formula 2]}$$

wherein $R^{14}$ and $R^{15}$ each independently represent a halogen, an amine group, —$R^{16}R^{17}$, or —$R^{17}$ bound to a silicon atom;

$R^{16}$ represents oxygen, or a sulfur atom;

$R^{17}$ represents hydrogen, an alkyl group, an aryl group, an aralkyl group, or an acyl group; and o is an integer ranging from 1 to 3; and an unsaturated silane and an aminosilane compound engrafted to the main chain, wherein the aminosilane compound is included in an amount of 1 to 40 parts by weight with respect to 100 parts by weight of the silane compound in the copolymer.

2. The copolymer of claim 1, wherein $R^1$ and $R^2$ each independently represent a hydroxyl group, or —$R^4R^5$ bound to the silicon atom;

$R^4$ represents oxygen;

$R^5$ represents an alkyl group;

$R^3$ represents —$OSiR^6{}_mR^7{}_{(2-m)}R^8$ bound to the silicon atom;

$R^6$ and $R^7$ each independently represent a hydroxyl group, or —$R^9R^{10}$ bound to the silicon atom;

$R^9$ represents oxygen;

$R^{10}$ represents an alkyl group;

$R^8$ represents —$(CH_2)_nNR^{11}R^{12}$ bound to the silicon atom, $R^{11}$ and $R^{12}$ each independently represent hydrogen, or $R^{13}NH_2$ bound to the nitrogen atom;

$R^{13}$ represents an alkylene group;

m is an integer of 1 or 2; and n is an integer greater than or equal to 0.

3. The copolymer of claim 1, wherein $R^1$ and $R^2$ each independently represent a hydroxyl group;

$R^3$ represents —$OSiR^6{}_mR^7{}_{(2-m)}R^8$ bound to the silicon atom;

$R^6$ and $R^7$ each independently represent a hydroxyl group;

$R^8$ represents —$(CH_2)$—$NR^{11}R^{12}$ bound to the silicon atom;

$R^{11}$ represents hydrogen;

$R^{12}$ represents $R^{13}NH_2$;

$R^{13}$ represents an alkylene group;

m is an integer of 1 or 2; and n is an integer greater than or equal to 0.

4. The copolymer of claim 1, wherein $R^{14}$ and $R^{15}$ each independently represent a hydroxyl group, or —$R^{16}R^{17}$ bound to a silicon atom;

$R^{16}$ represents oxygen; and $R^{17}$ represents an alkyl group.

5. A method of manufacturing the copolymer as defined in claim 1, the method comprising:

adding an olefin resin composition, which comprises an olefin resin, an unsaturated silane compound, an aminosilane compound, and a radical initiator, into a reaction vessel; and reactive extruding the olefin resin composition.

6. The method of claim 5, wherein the unsaturated silane compound is a compound represented by the following Formula 3:

$$DSiR^{18}{}_pR^{19}{}_{(3-p)} \qquad \text{[Formula 3]}$$

wherein D represents an alkenyl group bound to a silicon atom;

$R^{18}$ presents a hydroxyl group, a halogen, an amine group, or —$R^{20}R^{21}$ bound to a silicon atom;

$R^{20}$ represents oxygen, or a sulfur atom;

$R^{21}$ represents an alkyl group, an aryl group, or an acyl group;

$R^{19}$ represents hydrogen, an alkyl group, an aryl group, or an aralkyl group bound to a silicon atom; and p is an integer ranging from 1 to 3.

7. The method of claim 5, wherein the unsaturated silane compound is a vinyl alkoxy silane.

8. The method of claim 5, wherein the aminosilane compound is a compound represented by the following Formula 4:

$$SiR^{22}{}_qR^{23}{}_{(4-q)} \qquad \text{[Formula 4]}$$

wherein $R^{22}$ represents —$(CH_2)_rNR^{24}R^{25}$ bound to a silicon atom;

$R^{24}$ and $R^{25}$ each independently represent hydrogen, or $R^{26}NH_2$ bound to a nitrogen atom;

$R^{26}$ represents an alkylene group;

$R^{23}$ represents a halogen, an amine group, —$R^{27}R^{28}$, or —$R^{28}$ bound to a silicon atom;

$R^{27}$ represents oxygen, or a sulfur atom;

$R^{28}$ represents hydrogen, an alkyl group, an aryl group, an aralkyl group, or an acyl group;

q is an integer ranging from 1 to 4; and r is an integer greater than or equal to 0.

9. An encapsulant for optoelectronic devices comprising the copolymer as defined in claim 1.

10. The encapsulant of claim 9, further comprising an olefin resin.

11. The encapsulant of claim 10, wherein the olefin resin comprises an ethylene/α-olefin copolymer.

12. The encapsulant of claim 10, wherein the olefin resin and the copolymer as defined in claim 1 are present at a weight ratio of 1:1 to 20:1.

13. An optoelectronic device comprising a front substrate, the encapsulant for optoelectronic devices as defined in claim 9, an optoelectronic element, and a back sheet.

* * * * *